(12) United States Patent
Rupp

(10) Patent No.: US 11,138,151 B2
(45) Date of Patent: Oct. 5, 2021

(54) COMPRESSION SCHEME FOR FLOATING POINT VALUES

(71) Applicant: SAP SE, Walldorf (DE)

(72) Inventor: Martin Rupp, Edingen-Neckarhausen (DE)

(73) Assignee: SAP SE, Walldorf (DE)

(*) Notice: Subject to any disclaimer, the term of this patent is extended or adjusted under 35 U.S.C. 154(b) by 379 days.

(21) Appl. No.: 16/117,774

(22) Filed: Aug. 30, 2018

(65) Prior Publication Data
US 2020/0073958 A1 Mar. 5, 2020

(51) Int. Cl.
*G06F 16/13* (2019.01)
*G06F 16/14* (2019.01)
*G06F 7/483* (2006.01)

(52) U.S. Cl.
CPC ........... *G06F 16/137* (2019.01); *G06F 7/483* (2013.01); *G06F 16/144* (2019.01)

(58) Field of Classification Search
CPC .................................................. G06F 16/1744
USPC .......................................................... 707/693
See application file for complete search history.

(56) References Cited

U.S. PATENT DOCUMENTS

| 6,424,972 | B1 | 7/2002 | Berger et al. | |
| 2010/0095097 | A1* | 4/2010 | Gschwind | G06F 9/3887 |
| | | | | 712/222 |
| 2010/0318896 | A1* | 12/2010 | Ruellan | H03M 7/30 |
| | | | | 715/234 |
| 2013/0262539 | A1* | 10/2013 | Wegener | G06F 7/483 |
| | | | | 708/204 |

OTHER PUBLICATIONS

Extended European Search Report dated Jan. 29, 2020, 7 pages.
Wenbin Fang et al, "Database Compression on Graphics Processors", Proceedings of the VLDB Endowment Assoc. of Computing Machinery, vol. 3, No. 1-2, Sep. 1, 2010, pp. 670-680.

* cited by examiner

*Primary Examiner* — Baoquoc N To
(74) *Attorney, Agent, or Firm* — Fountainhead Law Group P.C.

(57) ABSTRACT

Some embodiments provide a non-transitory machine-readable medium that stores a program. The program determines a scale value based on a plurality of floating point values. The program further scales the plurality of floating point values based on the scale value. The program also converts the plurality of floating point values to a plurality of integer values. The program further determines an integer encoding scheme from a plurality of integer encoding schemes. The program also encodes the plurality of integer values based on the determined integer encoding scheme.

20 Claims, 17 Drawing Sheets

400

| Date 405 | Temperature 410 |
|---|---|
| 1/1/2015 | 38 |
| 1/4/2015 | 36 |
| 1/8/2015 | 39 |
| 1/14/2015 | 42 |
| 1/18/2015 | 41 |
| 1/23/2015 | 41 |
| 1/25/2015 | 45 |
| 1/28/2015 | 40 |

Block 1 — 505 / 520

| Date | Temperature |
|---|---|
| 1/30/2015 | 49 |
| 2/2/2015 | 52 |
| 2/6/2015 | 51 |
| 2/11/2015 | 51 |
| 2/16/2015 | 51 |
| 2/19/2015 | 56 |
| 2/22/2015 | 55 |
| 2/25/2015 | 54 |

Block 2 — 510 / 525

| Date | Temperature |
|---|---|
| 2/28/2015 | 55 |
| 3/1/2015 | 57 |
| 3/4/2015 | 61 |
| 3/7/2015 | 60 |
| 3/10/2015 | 59 |
| 3/17/2015 | 65 |
| 3/22/2015 | 64 |
| 3/24/2015 | 63 |

Block 3 — 515 / 530

| Block of Rows | Minimum | Maximum |
|---|---|---|
| 505 | 1/1/2015 | 1/28/2015 |
| 510 | 1/30/2015 | 2/25/2015 |
| 515 | 2/28/2015 | 3/24/2015 |

605 — Block of Rows
610 — Minimum
615 — Maximum

620

| Block of Rows | Minimum | Maximum |
|---|---|---|
| 520 | 36 | 45 |
| 525 | 49 | 56 |
| 530 | 55 | 65 |

625 — Block of Rows
630 — Minimum
635 — Maximum

FIG. 6

|         | Date       | Temperature |         |
|---------|------------|-------------|---------|
|         | 405        | 410         |         |

1005 → Block 1

| Date | Temperature |
|------|-------------|
| 1/1/2015 | 38 |
| 1/4/2015 | 36 |
| 1/8/2015 | 39 |
| 1/14/2015 | 42 |
| 1/18/2015 | 41 |
| 1/23/2015 | 41 |

← 1025

1010 → Block 2

| | |
|------|-------------|
| 1/25/2015 | 45 |
| 1/28/2015 | 40 |
| 1/30/2015 | 49 |
| 2/2/2015 | 52 |
| 2/6/2015 | 51 |
| 2/11/2015 | 51 |

← 1030

1015 → Block 3

| | |
|------|-------------|
| 2/16/2015 | 51 |
| 2/19/2015 | 56 |
| 2/22/2015 | 55 |
| 2/25/2015 | 54 |
| 2/28/2015 | 55 |
| 3/1/2015 | 57 |

← 1035

1020 → Block 4

| | |
|------|-------------|
| 3/4/2015 | 61 |
| 3/7/2015 | 60 |
| 3/10/2015 | 59 |
| 3/17/2015 | 65 |
| 3/22/2015 | 64 |
| 3/24/2015 | 63 |

COMPRESSION SCHEME FOR FLOATING POINT VALUES

BACKGROUND

Database systems may store large amounts of data. Different database systems can use different methods of storing data. For example, some database systems store data in tables while other database systems may store data in files such as spreadsheets, documents, media, etc. The type of data that is stored varies across different database systems. For instance, some database systems may store structured data. On the other hand, some database system can store unstructured data. Many techniques can be used to search for specific data in the database system. For example, some database systems iterate though all the data in the database system in order to identify data that matches a query. Other database system may use indexes for faster searching.

SUMMARY

In some embodiments, a non-transitory machine-readable medium stores a program. The program determines a scale value based on a plurality of floating point values. The program further scales the plurality of floating point values based on the scale value. The program also converts the plurality of floating point values to a plurality of integer values. The program further determines an integer encoding scheme from a plurality of integer encoding schemes. The program also encodes the plurality of integer values based on the determined integer encoding scheme.

In some embodiments, the program may further store the encoded plurality of integer values in a file in a file storage. The plurality of floating point values may be a first plurality of floating point values. The program may also receive a query on the plurality of floating point values; retrieve the file from the file storage in response to receiving the query; decode the encoded plurality of integer values in the file based on the integer encoding scheme; convert the decoded plurality of integer values to a second plurality of floating point values; unscale the second plurality of floating point values; and process the query on the second plurality of floating point values. The scale value may be a first scale value. The first scale value may be a power of 10. The program may further store the first scale value in terms of an integer exponent produces the first scale value when a value of 10 is raised to the power of the integer exponent. Unscaling the plurality of floating point values may include calculating a second scale value by raising a value of 10 to a power of the integer exponent and dividing plurality of floating point values by calculated second scale value.

In some embodiments, scaling the plurality of floating point values may include multiplying each floating point value in the plurality of floating point values by the scale value. The program may further receive a request to store the plurality of floating point values in a file. Determining the scale value may include iterating through the plurality of floating point values, identifying the lowest floating point value in the plurality of floating point values, and determining a value for the scale value such that multiplying the lowest floating point value by the scale value produces the lowest integer.

In some embodiments, a method determines a scale value based on a plurality of floating point values. The method further scales the plurality of floating point values based on the scale value. The method also converts the plurality of floating point values to a plurality of integer values. The method further determines an integer encoding scheme from a plurality of integer encoding schemes. The method also encodes the plurality of integer values based on the determined integer encoding scheme.

In some embodiments, the method may further store the encoded plurality of integer values in a file in a file storage. The plurality of floating point values may be a first plurality of floating point values. The method may further receive a query on the plurality of floating point values; retrieve the file from the file storage in response to receiving the query; decode the encoded plurality of integer values in the file based on the integer encoding scheme; convert the decoded plurality of integer values to a second plurality of floating point values; unscale the second plurality of floating point values; and process the query on the second plurality of floating point values. The scale value may be a first scale value. The first scale value may be a power of 10. The method may further store the first scale value in terms of an integer exponent produces the first scale value when a value of 10 is raised to the power of the integer exponent. Unscaling the plurality of floating point values may include calculating a second scale value by raising a value of 10 to a power of the integer exponent and dividing plurality of floating point values by calculated second scale value.

In some embodiments, scaling the plurality of floating point values may include multiplying each floating point value in the plurality of floating point values by the scale value. The method may further receive a request to store the plurality of floating point values in a file. Determining the scale value may include iterating through the plurality of floating point values, identifying the lowest floating point value in the plurality of floating point values, and determining a value for the scale value such that multiplying the lowest floating point value by the scale value produces the lowest integer.

In some embodiments, a system includes a set of processing units and a non-transitory machine-readable medium that stores instructions. The instructions cause at least one processing unit to determine a scale value based on a plurality of floating point values. The instructions further cause the at least one processing unit to scale the plurality of floating point values based on the scale value. The instructions also cause the at least one processing unit to convert the plurality of floating point values to a plurality of integer values. The instructions further cause the at least one processing unit to determine an integer encoding scheme from a plurality of integer encoding schemes. The instructions also cause the at least one processing unit to encode the plurality of integer values based on the determined integer encoding scheme.

In some embodiments, the instructions may further cause the at least one processing unit to store the encoded plurality of integer values in a file in a file storage. The plurality of floating point values may be a first plurality of floating point values. The instructions may also cause the at least one processing unit to receive a query on the plurality of floating point values; retrieve the file from the file storage in response to receiving the query; decode the encoded plurality of integer values in the file based on the integer encoding scheme; convert the decoded plurality of integer values to a second plurality of floating point values; unscale the second plurality of floating point values; and process the query on the second plurality of floating point values. The scale value may be a first scale value. The first scale value may be a power of 10. The instructions may further cause the at least one processing unit to store the first scale value in terms of an integer exponent produces the first scale value when a value of 10 is raised to the power of the integer exponent. Unscaling the plurality of floating point values may include calculating a second scale value by raising a value of 10 to a power of the integer exponent and dividing plurality of floating point values by calculated second scale value.

In some embodiments, scaling the plurality of floating point values may include multiplying each floating point value in the plurality of floating point values by the scale value. The instructions further cause the at least one processing unit to receive a request to store the plurality of floating point values in a file.

The following detailed description and accompanying drawings provide a better understanding of the nature and advantages of the present invention.

BRIEF DESCRIPTION OF THE DRAWINGS

FIG. 5 illustrates the table illustrated in FIG. 4 divided into blocks of rows according to some embodiments.

FIG. 6 illustrates data metadata associated with the columns of the table illustrated in FIG. 4 according to some embodiments.

FIG. 10 illustrates the table illustrated in FIG. 4 divided into blocks of rows according to some embodiments.

DETAILED DESCRIPTION

Figure 1:
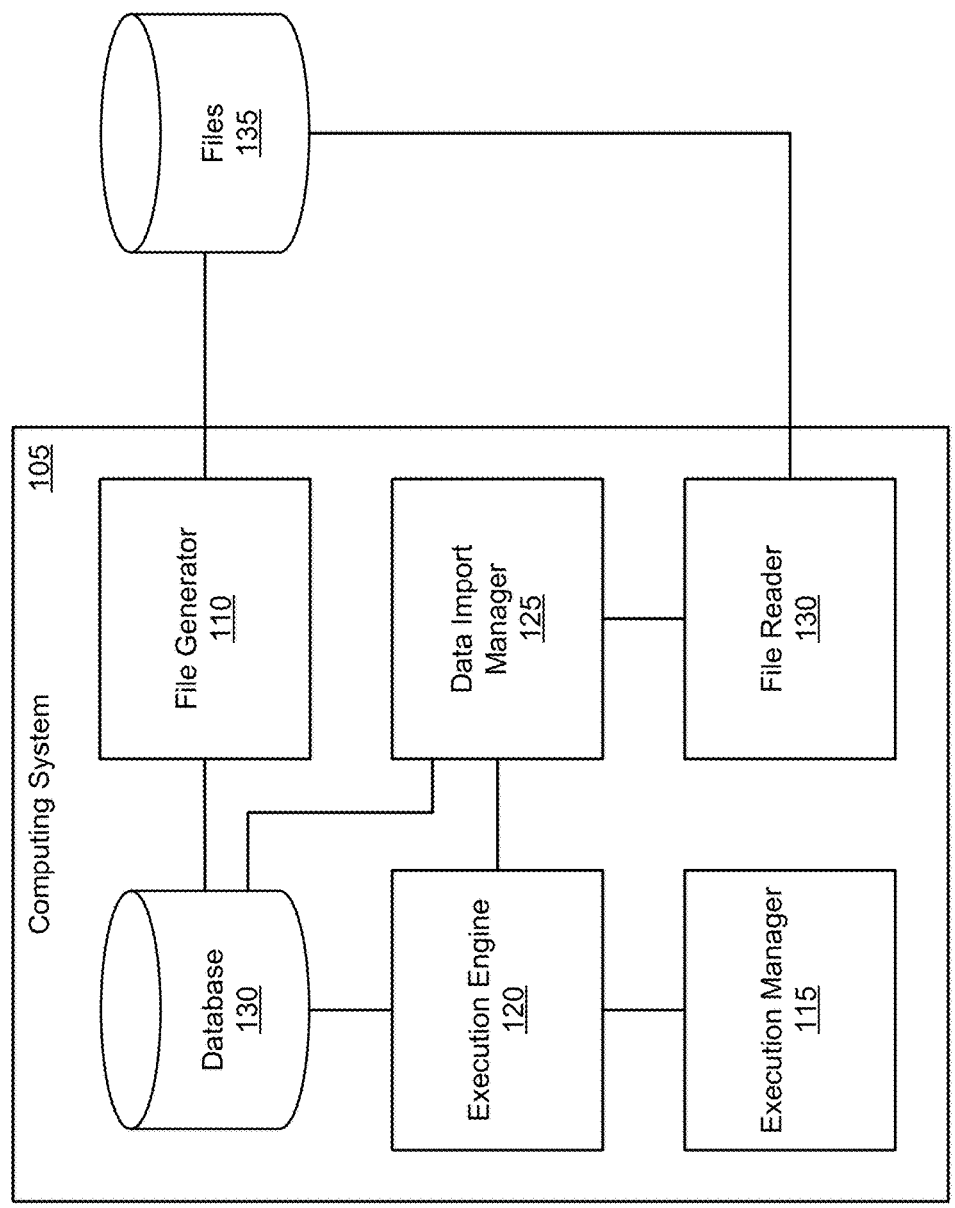
FIG. 1 illustrates a system according to some embodiments.

In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Described in section I of the present application are techniques for creating files of data based on a file format (referred to as a format2 file) that allows efficient and fast access to data in the files. In some embodiments, a system may periodically create such files from tables of data in a database. When creating a file from a table, the system encodes and/or compresses different types of data in the table using different encoding and/or compression schemes. The system may also generate metadata associated with the table, columns, and/or data in the columns. Once the files are created, the system can store them in a file storage (e.g., a local file storage, a remote file storage, etc.). When the system receives a query for data stored in one of the files, the system retrieves the corresponding file from the file storage, loads portions of the file that likely have the desired data into the database, processes the query on the loaded portions of the file, and returns the results of the query.

The techniques described in section I of the present application provide a number of benefits and advantages over conventional files of data. First, due to the manner in which data is organized in the file format, the system reduces the amount of data read (e.g., reduces the amount of bandwidth used) by loading portions of the file into the database that likely does have the desired data while avoiding loading portions of the file into the database that categorically does not have the desired data. Second, by encoding and/or compressing different types of data in a table using different encoding and/or compression schemes, the system reduces the storage size of the data when creating a file from data in the table. In turn, this reduces latencies in retrieving or accessing such files. For example, when a file is stored remotely, the time to read from the remote file is a function of the amount of data read and constant overhead. The amount of time to read from the remote file can be expressed as follows: time_to_read(num_bytes)=roundtrip_overhead+ num_bytes*read_overhead_per_byte. In some instances, the roundtrip_overhead is large enough that reads of 1 byte up to 1000 byte take approximately the same amount of time. The file format described in section I of the present application is structured in a way that reduces the number of reads by, for example, reducing 10 reads of 100 bytes to 1 read of 1000 bytes.

Further, described in section II of the present application are techniques for improving the speed of searches in large files of data. As mentioned above, the system may create files of data from tables of data in a database. When creating such a file, a system can create a data structure that stores information associated with values of data in a column of a table. The system may create these data structures for each column in the table and store them in the file. If the system receives a query on a column of the table, the system may utilize the information in the corresponding data structure to identify portions of the file that likely does have the desired data and identify portions of the file that categorically does not have the desired data. Then, the system loads only the portions of the file that likely does have the desired data into the database and processes the query on the loaded portions of the file in order to generate results for the query.

The techniques described in section II of the present application provide a number of benefits and advantages over conventional methods of performing searches on data in files. For instance, by creating data structures for storing information associated with values of data in columns of a table, the system can later leverage the information when processing queries on data in the file by determining portions of the file that likely does have the desired data and determining portions of the file that categorically does not have the desired data. The system accesses only the portions of the file that are likely to have the desired data and avoids accessing the portions of the file that categorically does not have the desired data, thereby processing queries in a faster and more efficient manner. These techniques are particularly effective at quickly processing queries for a small portion of a large set of data.

In addition, described in section III of the present application are techniques for compressing floating point data. In some embodiments, the system compresses a set of floating point values by analyzing the set of floating point values to determine a scale value. The system then scales the floating point values based on the scale value and converts them to integer representations of the scaled floating point values. Next, the system uses any number of different integer encoding schemes to encode the integer representations of the converted and scaled floating point values.

The techniques described in section III of the present application provide a number of benefits and advantages over conventional methods of storing floating point data. For example, scaling floating point values and converting them to integer values allows the system to employ more favorable encoding and compression schemes on the floating point data. It also reduces the amount of storage space used for storing floating point data.

I. Format2 File Format

FIG. 1 illustrates a system 100 according to some embodiments. As shown, system 100 includes computing system 105 and files storage 135. Files storage 135 is configured to store format2 files. In some embodiments, files storage 135 is implemented on another system (not shown) as part of a storage area network (SAN), a clustered storage system, a cloud storage system, etc. While FIG. 1 shows files storage 135 as external to computing system 105, one of ordinary skill in the art will appreciate that files storage 135 may be part of computing system 105 in some embodiments. Additionally, one of ordinary skill in the art will understand that, in some embodiments, multiple file storages may be used. In some such embodiments, the multiple file storages may be distributed across computing system 105 and/or any number of different systems.

Figure 2:
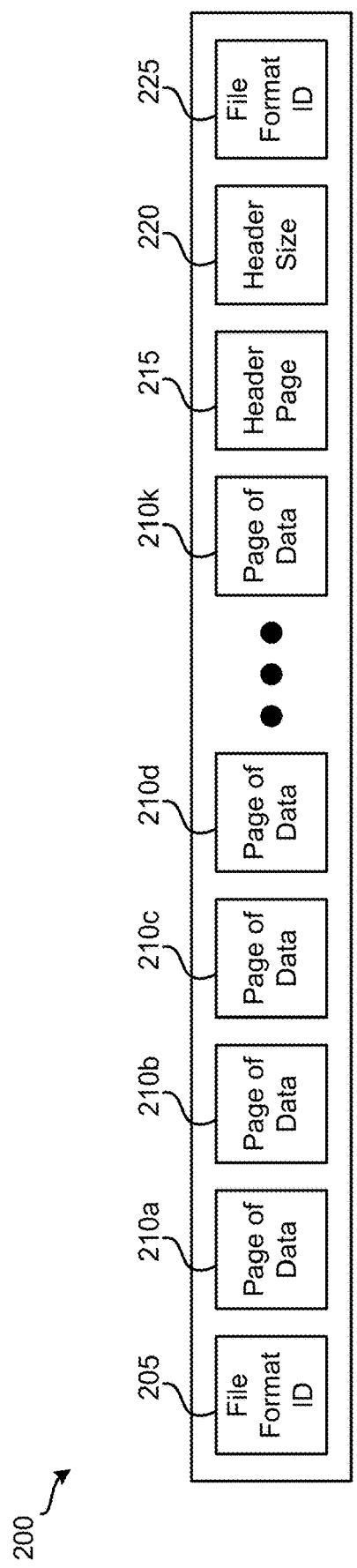
FIG. 2 illustrates a layout of a file format according to some embodiments.

In some embodiments, system 100 is responsible for managing (e.g., creating, storing, accessing, etc.) files of data formatted as format2 files. FIG. 2 illustrates a layout 200 of a file format according to some embodiments. Specifically, layout 200 is a high-level depiction of a file format that allows efficient access to data in the files as described in the present application. As shown, layout 200 includes file format identifier (ID) 205, pages of data 210a-210k, header page 215, header size 220, and file format ID 225. In some embodiments, multi-byte numbers are stored as little-endian. File format ID 205 and file format ID 225 are each configured to store a unique value for identifying the file format. In some embodiments, file format ID 205 and file format ID 225 are each a 32-bit signed integer with a value of "FMT2". In some embodiments, the 32-bit signed integer value of "FMT2" is the concatenation of the hexadecimal representation of each character in an American Standard Code for Information Interchange (ASCII) encoding. That is, the 32-bit signed integer value is 464D5432 (46 for "F", 4D for "T", 54 for "M", and 32 for "2").

Pages of data 210a-210k are each a separate, contiguous sequence of bytes configured to store various data as defined by header page 215. For example, pages of data 210a-210k can store values of a portion of a column of a table or superset tree structures (described in detail below). The size of pages of data 210a-210k may be different size, which is dictated by the data that is stored in pages of data 210a-210k. Header page 215 is a separate, contiguous sequence of bytes configured to store the version of the file format (e.g., a major version number, a minor version number, etc.), the number of total rows in a dataset being stored, the number of rows included in each block of rows, references to column metadata for columns in the dataset, and references to superset trees. Header size 220 is configured to store the size of header page 215 in terms of a number of bytes. In some embodiments, header size 220 is a 64-bit signed integer. As mentioned above, file format ID 225 is a 32-bit signed integer in some embodiments. Thus, in some embodiments where header size 220 is a 64-bit signed integer and file format ID 225 is a 32-bit signed integer, the offset of the header page can be calculated by subtracting 12 bytes (i.e., the size of a 64-bit signed integer and a 32-bit signed integer) and the value of header size 220 from the size of the file (i.e., header offset=size of file−12 bytes−size of header).

Figure 3:
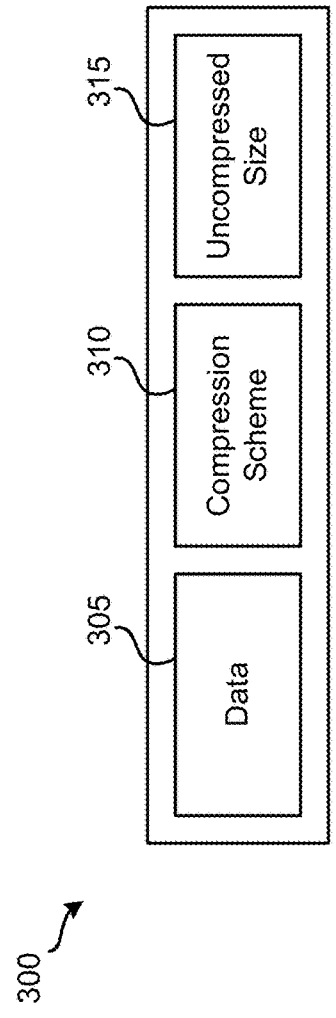
FIG. 3 illustrates a layout of a page of data according to some embodiments.

FIG. 3 illustrates a layout 300 of a page of data according to some embodiments. In particular, layout 300 illustrates the layout of each of pages of data 210a-210k and header page 215. As shown, layout 300 includes data 305, compression scheme 310, and uncompressed size 315. Data 305 is configured to store the actual data. In some embodiments, data 305 is an 8-bit integer array. Compression scheme 310 stores a value representing the compression scheme used to compress data 305 or a value representing that data 305 is uncompressed. In some cases, general purpose lossless compression schemes are used. For example, a value of "0" can be used to represent that data 305 is uncompressed, a value of "1" can be used to represent that data 305 is compressed using a zlib compression scheme, a value of "2" can be used to represent that data 305 is compressed using a lz4 compression scheme, a value of "3" can be used to represent that data 305 is compressed sing a snappy compression scheme, etc. In some embodiments, compression scheme 310 is an 8-bit signed integer. Uncompressed size 315 is configured to store the size of data 305 when it is uncompressed in terms of a number of bytes. In some embodiments, uncompressed size 315 is a 64-bit signed integer.

Returning back to FIG. 1, computing system 105 includes file generator 110, execution manager, execution engine 120, data import manager 125, file reader 130, and database 130. In some embodiments, a database management system (DBMS) provides access to and interacts with database 130. Database 130 stores data that may be used for generating format2 files. In some embodiments, data in database 135 is stored in one or more tables. Each table can include a set of fields. Each table can have one or more records that stores a value in each field of the table. In some embodiments, database 135 is implemented in a single physical storage while, in other embodiments, database 135 may be implemented across several physical storages. While FIG. 1 shows database 135 as part of computing system 105, one of ordinary skill in the art will recognize that database 135 may be external to computing system 105 in some embodiments.

File generator 110 is responsible for creating format2 files from data stored in database 130. In some embodiments, file generator 110 generates format2 files at defined intervals (e.g., once a day, once a week, once a month, etc.). During a defined interval, file generator 110 may access database 130 and identify tables of data that is older than a threshold age (e.g., two weeks, one month, six months, one year, etc.) or data that has not been accessed for a threshold amount of time (e.g., one week, two weeks, one month, etc.). File generator 110 then generate format2 files from the data in the identified tables.

Figure 4:
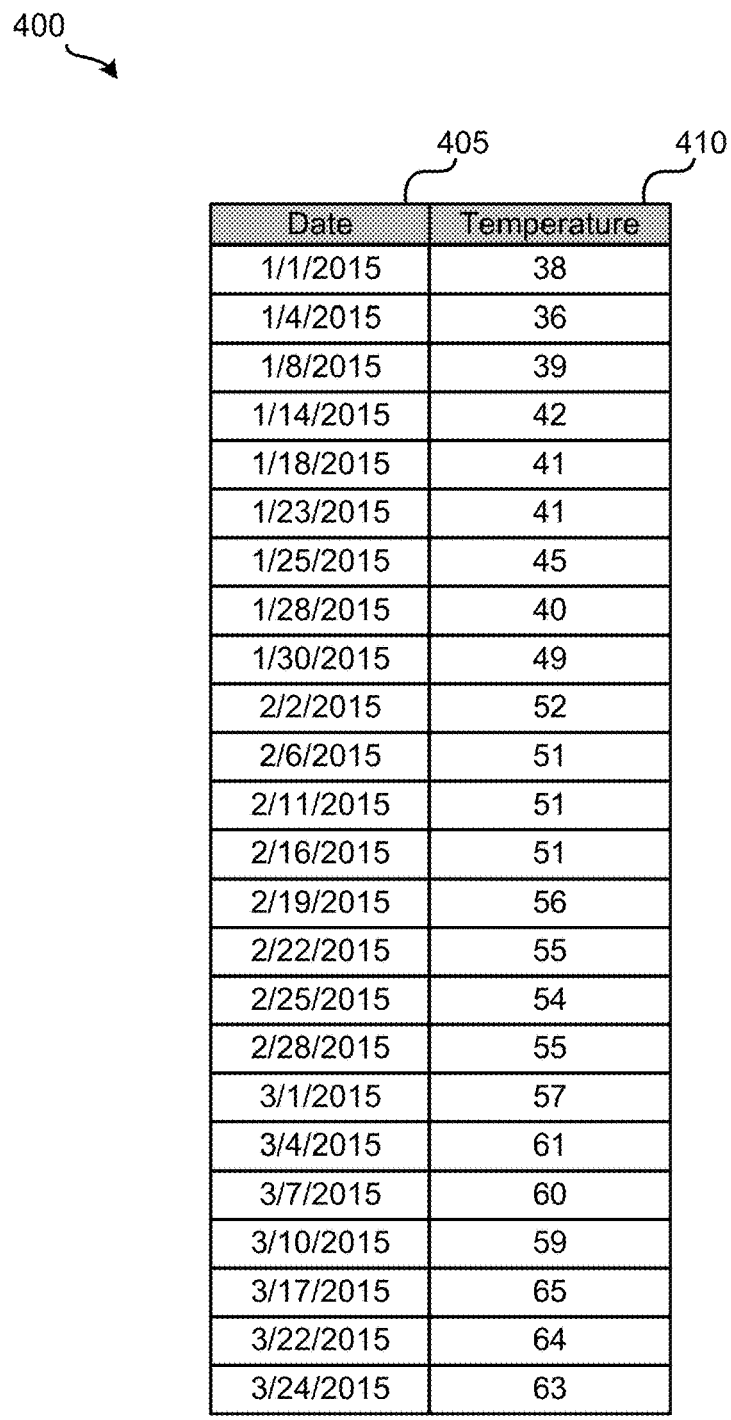
FIG. 4 illustrates an example table of data according to some embodiments.

An example operation of creating a format2 file from a table will now be described by reference to FIGS. 4-7. FIG. 4 illustrates an example table 400 of data according to some embodiments. For this example, table 400 is stored in database 130 and will be used to create a format2 file. As illustrated, table 400 includes two columns 405 and 410 and twenty-four rows of data. Column 405 is configured to store date values that represent the day, month, and year on which temperatures were recorded. Column 410 is configured to store integer values that represent temperatures (Fahrenheit).

The operation starts by file generator 110 accessing table 400 in database 130. Next, file generator 110 divides table 400 into blocks of rows. In this example, file generator 110 divides table 400 into three blocks of rows that each include eight rows of data. File generator 110 also splits the blocks of rows into separate column chunks (also referred to as fragments). FIG. 5 illustrates table 400 illustrated in FIG. 4 divided into blocks of rows according to some embodiments. As shown, table 400 is divided into three blocks of rows. Each block of rows includes eight rows from table 400. In addition, FIG. 5 shows column 405 separated into fragments 505-515 and column 410 separated into fragments 520-530. Fragment 505 includes the data for column 405 in the first block of rows, fragment 510 includes the data for column 405 in the second block of rows, and fragment 515 includes the data for column 405 in the third block of rows. Similarly, fragment 520 includes the data for column 410 in the first block of rows, fragment 525 includes the data for column 410 in the second block of rows, and fragment 530 includes the data for column 410 in the third block of rows.

Continuing with the example, after dividing table 400 into blocks of rows, file generator 110 generates data metadata describing the values in each column 405 and 410. For this example, file generator 110 determines the minimum value and the maximum value in each column for each block of rows. FIG. 6 illustrates data metadata associated with the columns of the table illustrated in FIG. 4 according to some embodiments. Specifically, FIG. 6 shows data metadata 600 and data metadata 620. Data metadata 600 includes fields 605-615. Field 605 includes an identifier of a fragment, which is a column chunk in a block of rows. Field 610 includes the minimum value in the fragment and field 615 includes the maximum value in the fragment. Data metadata 620 includes fields 625-635. Field 625 includes an identifier of a fragment, field 630 includes the minimum value in the fragment, and field 635 includes the maximum value in the fragment.

Figure 7:
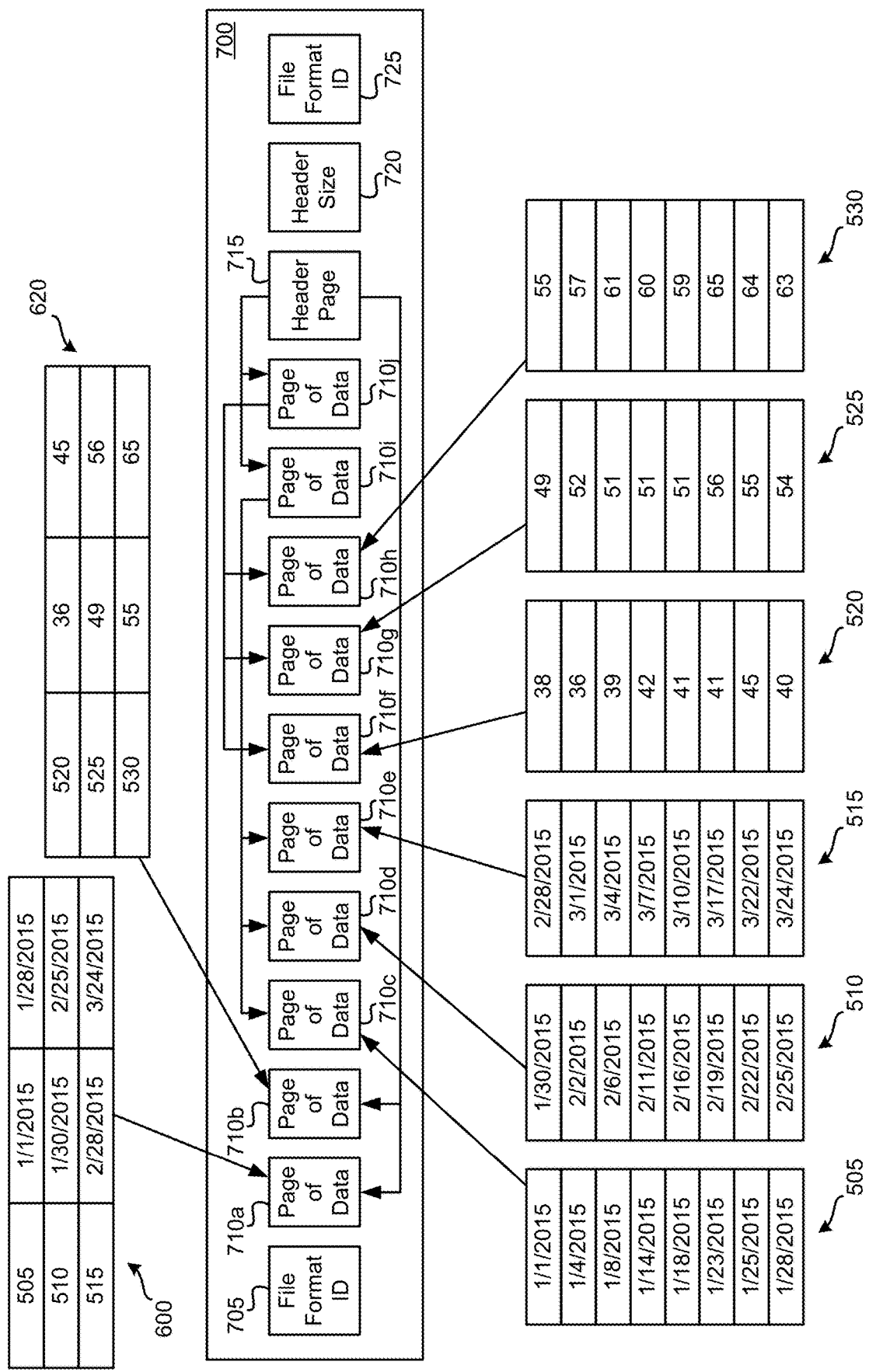
FIG. 7 illustrates a layout of a file created from the data in the table illustrated in FIG. 4 according to some embodiments.

Returning to the example, file generator 110 then starts constructing the file based on the fragments and generated data metadata. FIG. 7 illustrates a layout of a file 700 created from the data in table 400 illustrated in FIG. 4 according to some embodiments. As illustrated, file 700 includes file format ID 705, pages of data 710*a*-710*j*, header page 715, header size 720, and file format ID 725. In this example, file generator 110 constructed file 700 by writing data in the file from the front (i.e., the left side starting with file format ID 705) of file 700 towards the back of file 700 (i.e., the right side ending with file format ID 725).

File generator 110 starts by writing file format ID 705 in file 700 as a 32-bit signed integer with an integer value of "FMT2". Next, file generator 710 compresses data metadata 600 and data metadata 620 using a lossless compression scheme (e.g., a zlib compression scheme, a lz4 compression scheme, a snappy compression scheme, etc.). If the compressed data is less than a threshold ratio value (e.g., 85%, 90%, 95%, etc.) of the original size of the data, file generator 110 uses the compressed data to store in file 700. Otherwise, file generator 110 uses the original uncompressed data to store in file 700. File generator 110 then determines the uncompressed size of each of data metadata 600 and data metadata 620 in terms of a number of bytes. Next, file generator 110 uses the determined uncompressed sizes to format data metadata 600 and data metadata 620 according to layout 300 and writes them in file 700 as page of data 710*a* and page of data 710*b*, respectively.

After writing data metadata 600 and data metadata 620 to file 700, file generator 110 processes fragments 505-515 of column 405 and fragments 520-530 of column 410 for storage in file 700. In this example, the date values are 64-bit integers that store the date in terms of tenths of a second from the date of Jan. 1, 1970. For each of fragments 505-515, file generator 110 encodes the data values using an integer encoding scheme. For each of fragments 520-530, file generator 110 encodes the integer values using an integer encoding scheme.

File generator 110 can use any number of different integer encoding schemes. For example, a first encoding scheme is a runlength encoding scheme where the number of times a value appears and the actual value are stored using a variable-length quantity (VLQ) encoding coupled with zig-zag encoding for negative values. A second encoding scheme is a bitwise encoding scheme that determines a minimum number of bits needed to represent the range of values in a sequence of integer values. The bitwise encoding scheme stores the size of an array used to store the values, the number of bits used to represent the values, and the array of the values represented using the minimum number of bits. The size of an array used to store the values and the number of bits used to represent the values can be stored using two VLQ encoded values. A third integer encoding scheme is a delta runlength encoding scheme where the first value in a sequence of integer values is stored using a VLQ encoding scheme and each subsequent value in the sequence of integer values are stored based on the difference (i.e., the delta) between the value and the previous value in the sequence of integer values. The deltas are encoded using a runlength encoding scheme (e.g., the first encoding scheme). A fourth integer encoding scheme is a delta bitwise encoding scheme where the first value in a sequence of integer values is stored using a VLQ encoding scheme and each subsequent value in the sequence of integer values are stored based on the difference (i.e., the delta) between the value and the previous value in the sequence of integer values. The deltas are encoded using a bitwise encoding scheme (e.g., the second encoding scheme).

In some embodiments, file generator 110 automatically selects an integer encoding scheme from several different integer encoding schemes to use to encode a sequence of integer values. For this example, file generator 110 automatically selects an integer encoding scheme from the four integer encoding schemes mentioned above to use for encoding each of fragments 520-530. To determine which of the four integer encoding schemes to use, file generator 110 estimates the number of bytes that will be used by each integer encoding scheme and selects the integer encoding scheme with the lowest estimated number of bytes that will be used.

For the first integer encoding scheme, file generator 110 estimates the number of bytes that will be used with the runlength encoding scheme using the following equation (1):

$$\text{runlength\_encoding\_bytes} = (N - \text{num\_repeats}) * (vlq\_size(\max\_v) + (vlq\_size(N)))$$

where N is the number of values in a sequence of integer values; num_repeats is the number of repeat values in the sequence of integer values defined as the size of the set {i |value$_i$=value$_{i+1}$}, where value$_i$ is the i$^{th}$ integer value in the sequence of integer values; vlq_size( ) takes, as input, a value and returns the number of bytes needed to store data using a VLQ encoding scheme; and max_v is the maximum value in the sequence of integer values.

For the second integer encoding scheme, file generator 110 estimates the number of bytes that will be used with the bitwise encoding scheme using the following equation (2):

$$\text{bit\_encoding\_bytes} = \text{to\_bytes}(N * \max(\text{bits\_needed}(\max\_v), \text{bits\_needed}(\min\_v)))$$

where N is the number of values in a sequence of integer values; to_bytes( ) takes, as input, a number of bits and returns the number of bytes needed to store the number of bits; max( ) takes, as input, several values and returns the greater of the several values; bits_needed( ) takes, as input, a value and returns the minimum number of bits needed to represent the value; max_v is the maximum value in the sequence of integer values; and min_v is the minimum value in the sequence of integer values.

For the third integer encoding scheme, file generator 110 estimates the number of bytes that will be used with the delta runlength encoding scheme using the following equation (3):

$$\text{delta\_runlength\_encoding\_bytes} = vlq\_size(\text{value}_1) + (N - 1 - \text{num\_repeats\_delta}) * (vlq\_size(\max\_delta) + vlq\_size(N-1))$$

where N is the number of values in a sequence of integer values, value) is the first value in the sequent of integer values; vlq_size( ) takes, as input, a value and returns the number of bytes needed to store data using a VLQ encoding scheme; num_repeats_delta is the number of repeat deltas between sequential integer values in the sequence of integer values as defined as the size of the set {i |value$_{i+1}$−value$_i$=value$_{i+2}$−value$_{i+1}$}; and max_delta is the largest delta between sequential integer values in the sequence of integer values as defined as defined as max(abs(value$_2$−value$_1$), abs(value$_3$−value$_2$), abs(value$_4$−value$_3$), . . . , abs(value$_N$−value$_{N-1}$)).

For the fourth integer encoding scheme, file generator 110 estimates the number of bytes that will be used with the delta bitwise encoding scheme using the following equation (4):

$$\text{delta\_bit\_encoding\_bytes} = vlq\_size(\text{value}_1) + vlq\_size(N) + vlq\_size(\text{bitwidth\_delta}) + \text{to\_byte}(\text{bitwidth\_delta} * N)$$

where N is the number of values in a sequence of integer values, value) is the first value in the sequent of integer values; vlq_size( ) takes, as input, a value and returns the number of bytes needed to store data using a VLQ encoding scheme; bitwidth_delta is defined as max(bits_needed(max_delta), bits_needed(min_delta)), where max_delta is the largest delta between sequential integer values in the sequence of integer values as defined as defined as max(abs(value$_2$−value$_1$), abs(value$_3$−value$_2$), abs(value$_4$−value$_3$), . . . , abs(value$_N$−value$_{N-1}$)) and min_delta is the smallest delta between sequential integer values in the sequence of integer values as defined as min(abs(value$_2$−value$_1$), abs(value$_3$−value$_2$), abs(value$_4$−value$_3$), . . . , abs(value$_N$−value$_{N-1}$)); and to_bytes( ) takes, as input, a number of bits and returns the number of bytes needed to store the number of bits.

As explained above, file generator 110 automatically selects an integer encoding scheme from the four integer encoding schemes mentioned above to use for encoding each of fragments 520-530. Specifically, file generator 110 automatically selects an integer encoding scheme to use for encoding fragment 520 by calculating an estimated number of bytes that will be used by each of the four integer encoding schemes based on equations (1)-(4). Then, file generator 110 selects the integer encoding scheme with the lowest estimated number of bytes that will be used and uses it to encode the integer values in fragment 520. File generator 110 automatically selects an integer encoding scheme to use for encoding fragments 525 and 530 in a similar fashion. File generator 110 stores the integer encoding scheme used for a particular fragment by writing a value associated with the selected integer encoding scheme (e.g., a value of 0 is associated with the runlength encoding scheme, a value of 1 is associated with the bitwise encoding scheme, a value of 2 is associated with the delta runlength encoding scheme, and a value of 3 is associated with the delta bitwise encoding scheme) as a VLQ encoded value followed by the encoded values in the fragment.

After encoding one of the fragments 505-530, file generator 110 compresses the value associated with the selected integer encoding scheme and the encoded data in the same manner described above in the discussion of data metadata 600 and data metadata 620. That is, file generator 110 compresses the data using a lossless compression scheme, determines whether the compressed data is less than the threshold ratio value of the original size of the data, and uses either the compressed data or the original uncompressed data to store in file 700 accordingly. File generator 110 then determines the uncompressed size of the fragment in terms of a number of bytes, uses the determined uncompressed sizes to format the fragment according to layout 300, and writes them in file 700. As shown in FIG. 7, file generator 110 writes fragments 505 as page of data 710*c*, fragment 510 as page of data 710*d*, fragment 515 as page of data 710*e*, fragment 520 as page of data 710*f*, fragment 525 as page of data 710*g*, and fragment 530 as page of data 710*h*.

Next, file generator 110 generates column metadata for each of the columns 405 and 410 in table 400. For this example, column metadata for a column includes the type of data stored in the column, an offset from the beginning of the file to the start of each fragment of column data, one or more encoding schemes used to encode values in the column, the name of the column, an SQL type, and the number of null values in the column. In some embodiments, different fragments of a column may be encoded using different encoding schemes. In some such embodiments, the encoding scheme used for each fragment of a column is stored in the column metadata. The SQL type stores a structured query language (SQL) data type.

After generating the column metadata for column 405, file generator 110 compresses the column metadata using a lossless compression scheme, determines whether the compressed column metadata is less than the threshold ratio value of the original size of the data, and uses either the compressed column metadata or the original uncompressed column metadata to store in file 700 accordingly. Next, file generator 110 determines the uncompressed size of the column metadata in terms of a number of bytes, uses the determined uncompressed sizes to format the column metadata according to layout 300, and writes them in file 700. File generator 110 performs similar operations for the column metadata for column 410. In this example, file generator 110 writes the column metadata for column 405 as page of data 710*i* in file 700 and the column metadata for column 410 as page of data 710*j* in file 700.

Once file generator 110 writes pages of data 710*a*-710*j* to file 700, file generator 110 then generates a header page. For this example, file generator 110 includes in the header page a 16-bit integer storing a number representing a major version number; a 16-bit integer storing a number representing a minor version number; a 64-bit integer storing the number 24 representing the number of total rows of data being stored in file 700; an array of three unsigned 64-bit integers storing the numbers 8, 8, and 8 representing the number of rows in the first block of rows (i.e., block 1), the number of rows in the second block of rows (i.e., block 2), and the number of rows in the third block of rows (i.e., block 3), respectively; offsets from the beginning of file 700 to the start of each column metadata; the size of each column metadata in terms of a number of bytes; offsets from the beginning of file 700 to the start of each data metadata; and the size of each data metadata in terms of a number of bytes. In some embodiments, file generator 110 uses the automatic integer encoding scheme selection technique described above to encode the array of three 8-bit integers storing the number of rows in the blocks of rows, the offsets for the column metadata, the sizes of the column metadata, the offsets for the data metadata, and the sizes of the data metadata.

Once the header page is generated, file generator 110 compresses the header page using a lossless compression scheme, determines whether the compressed data is less than the threshold ratio value of the original size of the data, and uses either the compressed header page or the original uncompressed header page to store in file 700 accordingly. File generator 110 then determines the uncompressed size of the header page in terms of a number of bytes, uses the determined uncompressed sizes to format the header page according to layout 300, and writes them in file 700. In this example, file generator 110 writes the header page as header page 715 in file 700. File generator 110 also determines the size of header page 715 in term of a number of bytes and stores the value as header size 720 in file 700. In some embodiments, file generator 110 stores header size 720 using a 64-bit integer. Tile generator 110 then writes file format ID 725 in file 700 using a 32-bit signed integer with an integer value of "FMT2". Finally, file generator 110 stores file 700 in files storage 135.

The example operation described above discusses various techniques for encoding integer values. One of ordinary skill in the art will understand that other types of data can be encoded as well. For example, file generator 110 may store a sequence of string values as a continuous array of null-terminated strings, encode the number of string values in the sequence using a VLQ encoding scheme, and then compress the string values and the number of string values using a lossless compression scheme (e.g., a zlib compression scheme, a lz4 compression scheme, a snappy compression scheme, etc.). Floating point values can be encoded using the techniques described in Section III of the present application.

Many of the data encoding schemes described above split the actual values into multiple parts that use specialized encodings. Each of the parts can be decoded separately and then joined together to reconstruct the original values. Therefore, in some embodiments, file generator 110 uses a self-describing format for storing data 305 in layout 300 of a page of data (e.g., pages of data 210*a*-210*k* and pages of data 710*a*-710*j*). The self-describing aspect of the data format reduces the amount of overhead needed and as well as latencies involved in accessing the data compared to conventional methods of storing data.

Figure 8:
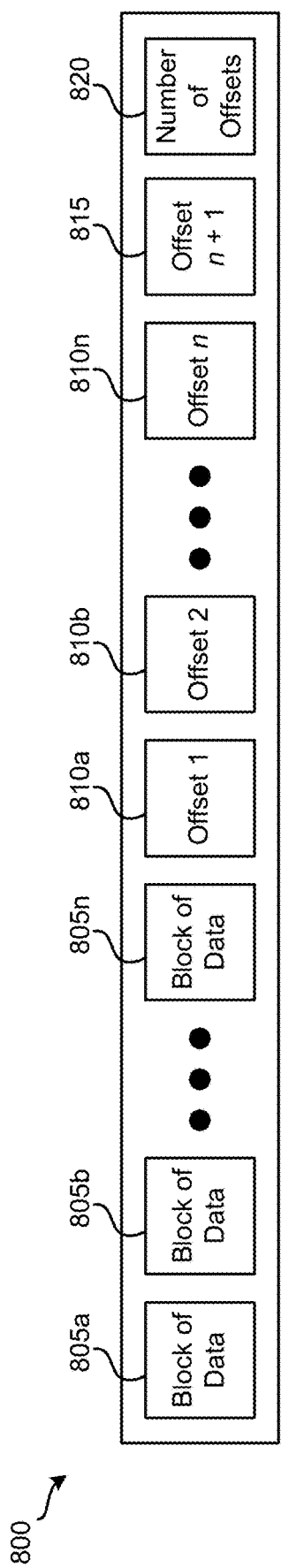
FIG. 8 illustrates a self-describing format for data in the layout of the page of data illustrated in FIG. 3 according to some embodiments.

FIG. 8 illustrates a self-describing format for data in the layout of the page of data illustrated in FIG. 3 according to some embodiments. In particular, FIG. 8 illustrates a layout 800 of such a format according to some embodiments. As shown, layout 800 includes blocks of data 805*a*-805*n*, offsets 810*a*-810*n*, offset 815, and number of offsets 820. Blocks of data 805*a*-805*n* are each a separate, contiguous sequence of bytes. Offsets 810*a*-810*n* are each configure to store an offset from the beginning of the layout 800 to the start of a corresponding block of data 805. Hence, offset 810*a* stores an offset from the beginning of layout 800 to the start of block of data 805*a*, offset 810*b* stores an offset from the beginning of layout 800 to the start of block of data 805*b*, etc. Offset 815 stores the offset from the beginning of layout 800 to the start of the first offset (i.e., offset 810*a*). The size of each block of data 805*a*-805*n* can be calculated from offsets 810*a*-810*n*. For example, the size of block 805*a* is calculated by subtracting value of offset 810*b* from the value of offset 810*a*, the size of block 805*b* is calculated by subtracting value of offset 810*c* from the value of offset 810*b*, etc. The size of block 805*n* may be calculated by subtracting value of offset 810*n* from the value of offset 815. Number of offsets 820 is configured to store the total number of offsets, which includes offsets 810*a*-810*n* and offset 815. In some embodiments, offsets 810*a*-810*n*, offset 815, and number of offsets 820 are stored using 64-bit integers.

As explained above, file generator 110 can store a sequence of string values (e.g., from a fragment of a column) as a continuous array of null-terminated strings and encode the number of string values in the sequence using a VLQ encoding scheme. In some embodiments where layout 800 is used to store the string values, file generator 110 stores the VLQ encoded number of string values at the beginning of the first block of data (e.g., block of data 805*a*) followed by the array of null-terminated strings (also in the first block of data). File generator 110 also stores an offset array that stores the offset of each string in the array of null-terminated strings. The offset array allows quick access to a particular string in the array of null-terminated strings without having to sequentially iterate through the array of null-terminated strings. In some instances where a column has NULL string values, file generator 110 stores a separate block of data to encode the NULL values.

In some instances, values in a fragment of a column of a table may contain null values. In some embodiments where layout 800 is used to a sequence of data values, file generator 110 stores information associated with null values in the last block of data (e.g., block of data 805*n*) of layout 800. If the fragment of the column does not include any no null values, file generator 110 stores the last block of data as having a size of zero bytes. If the fragment of the column does include null values, file generator 110 stores a Boolean array in the last block of data as an 8-bit integer array and encodes the array using the automatic integer encoding scheme selection techniques described above. For each row in the fragment of the column that does not store a NULL value, file generator 110 stores a corresponding FALSE value in the Boolean array. For each row in the fragment of the column that stores a NULL value, file generator 110 stores a corresponding TRUE value in the Boolean array.

The examples and embodiments explained above describe creating format2 files from data in a database. However, one of ordinary skill in the art will understand that format2 files can be created from other data sources or data streams in some embodiments. For instance, format2 files can be created from data stored in spreadsheets, a text file, etc.

Returning to FIG. 1, computing system 105 may handle queries for data stored in format2 files. An example operation of processing a query will now be described by reference to FIGS. 1 and 5-7. The operation starts by execution manager 115 receiving a query for data stored in file 700. The query may be received from a client device (not shown), an application operating on computing system (not shown), a service or process (not shown) executing on computing system 105, or any other device, system, component, element, etc. that is able to send a query to execution manager 115. In this example, the query is for rows in table 400 where the value in column 410 is greater than 47 and less than 60.

When execution manager 115 receives the query, execution manager 115 generates an execution plan based on the query. In some embodiments, an execution plan is an ordered set of operations for executing the query. After generating the execution plan, execution manager 115 sends the execution plan to execution engine 120. Upon receiving the execution plan, execution engine 120 executes the execution plan. To execute the execution plan for the query in this example, execution engine 120 instructs data import manager 125 to apply a filter on column 410 for rows in table 400 where the value in column 410 is greater than 47 and less than 60.

Once data import manager 125 receives the instructions from execution engine 120, data import manager 125 instructs file reader 130 to access file 700 in files storage 135. Next, data import manager 125 instructs file reader 130 to retrieve from file 700 header page 715, the page of data storing the column metadata for column 405 (i.e., page of data 710*i*), the page of data storing the column metadata for column 410 (i.e., page of data 710*j*), and the page of data storing data metadata 620 for column 410 (i.e., page of data 710*b*). The page of data storing data metadata 600 for column 405 (i.e., page of data 710*a*) does not need to be read since the filter is applied to column 410 and not column 405.

Then, data import manager 125 determines which blocks of rows are of interest based on data metadata 620. Since the range of values defined by the minimum value and the maximum value of block of rows 520 is completely outside the range of values defined by the query, data import manager 125 determines that block of rows 520 can be skipped. Next, data import manager 125 determines to include all the rows in block of rows 525 in the results for the query because the range of values defined by the minimum value and the maximum value of block of rows 525 is completely inside the range of values defined by the query. Data import manager 125 then determines that some of the rows in fragment 530 may be included in the results for the query as the range of values defined by the minimum value and the maximum value of fragment 530 overlaps with, but is not completely inside, the range of values defined by the query.

Data import manager 125 sends file reader 130 the offsets and sizes for page of data 710*g* and page of data 710*h*, which data import manager 125 retrieves from the column metadata for column 410, and instructs file reader 130 to retrieve fragments 525 and 530 from pages of data 710*g* and 710*h*. Upon receiving fragments 525 and 530, data import manager 125 identifies the rows in fragment 530 that satisfy the query (the first, second, and fifth rows in fragment 530). Data import manager 125 then sends file reader 130 the offsets and sizes for page of data 710*d* and page of data 710*e*, which data import manager 125 retrieves from the column metadata for column 405, and instructs file reader 130 to retrieve fragments 510 and 515 from pages of data 710*d* and 710*e*. Data import manager 125 identifies the rows in fragment 515 that correspond to the rows in fragment 530 that satisfied the query. Data import manager 125 then includes the identified rows in fragment 515, the identified rows in fragment 530, all the rows in fragment 510, and all the rows in fragment 525 in the results for the query and sends the results for the query to execution engine 120, which forwards it to execution manager 115. Finally, execution manager 115 sends the results for the query to the element from which execution manager 115 received the query.

Figure 9:
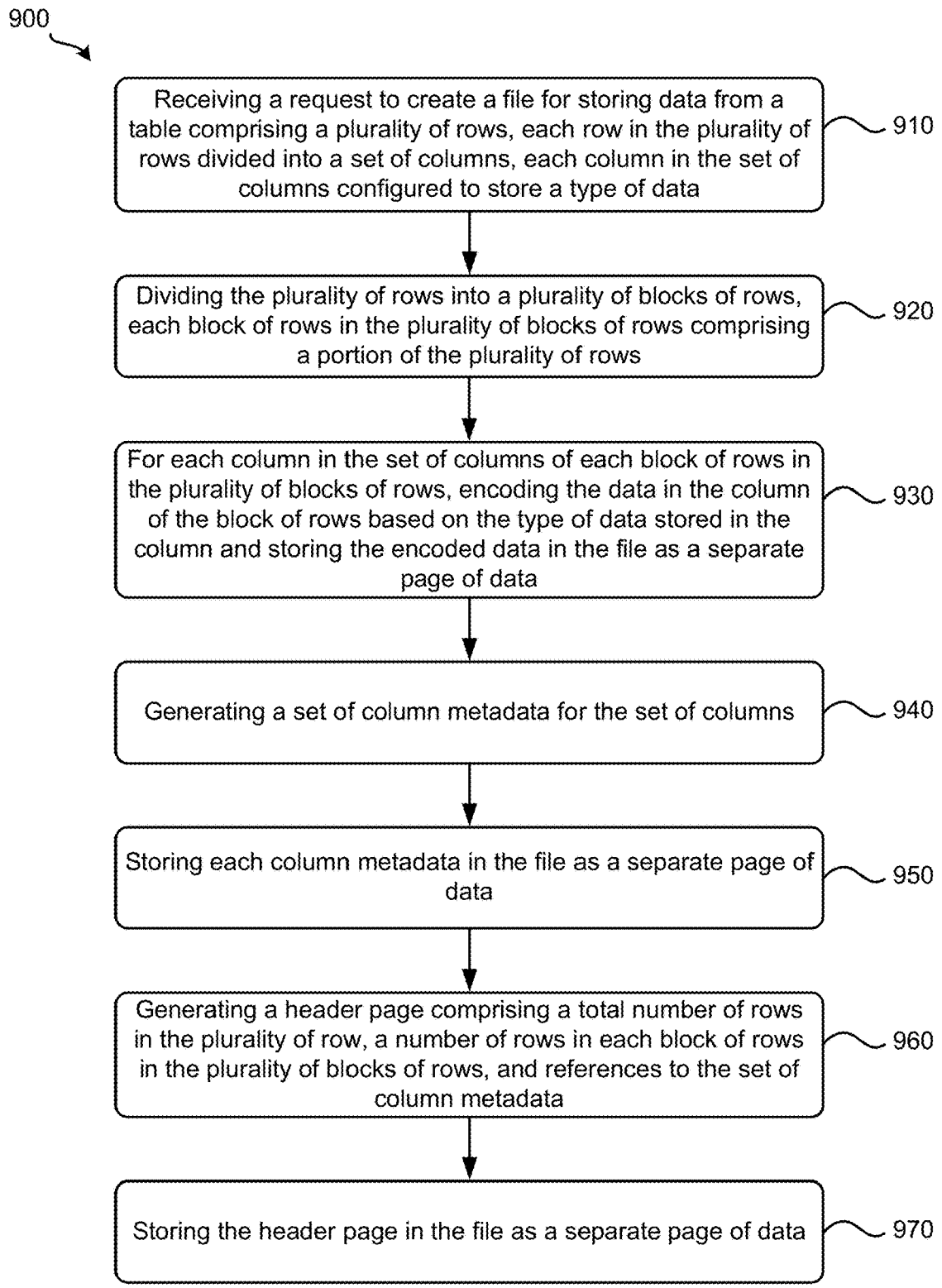
FIG. 9 illustrates a process for creating a file formatted for accessing data quickly and efficiently according to some embodiments.

FIG. 9 illustrates a process 900 for creating a file formatted for accessing data quickly and efficiently according to some embodiments. In some embodiments, file generator 110 performs process 900. Process 900 begins by receiving, at 910, a request to create a file for storing data from a table comprising a plurality of rows. Each row in the plurality of rows is divided into a set of columns. Each column in the set of columns is configured to store a type of data. Referring to FIGS. 1 and 4 as an example, file generator 110 may receive a request to create a file for storing data in table 400.

Next, process 900 divides, at 920, the plurality of rows into a plurality of blocks of rows. Each block of rows in the plurality of blocks of rows includes a portion of the plurality of rows. Referring to FIGS. 1 and 5 as an example, file generator 110 may divide the rows in table 400 into three blocks of rows 505-515. For each column in the set of columns of each block of rows in the plurality of blocks of rows, process 900 then encodes, at 930, the data in the column of the block of rows based on the type of data stored in the column and stores the encoded data in the file as a separate page of data. Process 900 may encode the values in column 410 using the automatic integer encoding scheme selection technique described above.

Next, process 900 generates, at 940, a set of column metadata for the set of columns. Each column metadata includes the type of data stored in a corresponding column in the set of columns, an encoding scheme is used to encode the data in the corresponding column, and references to the plurality of blocks of rows for the corresponding column. Then, process 900 stores, at 950, each column metadata in the file as a separate page of data. Referring to FIGS. 1, 4, and 7 as an example, file generator 110 can store the column metadata for column 405 as page of data 710*i* in file 700 and the column metadata for column 410 as page of data 710*j* in file 700.

Process 900 then generates, at 960, a header page that includes a total number of rows in the plurality of row, a number of rows in each block of rows in the plurality of blocks of rows, and references to the set of column metadata. Finally, process 900 stores, at 970, the header page in the file as a separate page of data. Referring to FIGS. 1, 4, and 7, as an example, file generator 110 stores the header page as header page 715 in file 700.

II. Superset Tree Data Structures

In Section I, an example operation of processing a query on a format2 file describes using data metadata in the file to process the query. Computing system 105 can use superset tree data structures to implement the data metadata. In some embodiments, a superset tree data structure is a rooted, full, and complete binary tree. In some such embodiments, the root of the superset tree data structure stores values (i.e., a rooted superset tree data structure), each node in the superset tree data structure has either zero or two children (i.e., a full superset tree data structure), and each level in the superset tree data structure is full except possibly the lowest level (i.e., a complete superset tree data structure).

In some embodiments, a superset tree data structure generated for a column has the same number of leaf nodes as the number of fragments of the column. File generator 110 may calculate the height of a superset tree data structure (e.g., a superset data structure with three levels has a height of two, a superset data structure with five levels has a height of four, etc.) based on the number of fragments in a column using the following equation (5):

$$height = ceil(\log_2(fragments))$$

where ceil( ) takes, as input, a value, and returns the smallest integer value greater than the value and fragments is the number of fragments in a column. File generator 110 can then calculate the number of leaf nodes in the penultimate level (i.e., second-lowest level) using the following equation (6):

$$leaf\_nodes\_penultimate = height^2 - fragments$$

where height is the height of a superset tree data structure and fragments is the number of fragments in a column. Next, file generator 110 may calculate the number of nodes in the penultimate level (i.e., the second-lowest level) that have two children nodes using the following equation (7):

$$nodes\_penultimate\_with\_children = \frac{fragments - leaf\_nodes\_penultimate}{2}$$

where fragments is the number of fragments in a column and leaf_nodes_penultimate is the number of leaf nodes in the penultimate level of a superset tree data structure. File generator 110 can then calculate the total number of nodes in the superset tree data structure using the following equation (8):

$$total\_nodes = 2^{height} - 1 + 2 * nodes\_penultimate\_with\_children$$

where height is the height of a superset tree data structure and nodes_penultimate_with_children is the number of nodes in the penultimate level (i.e., the second-lowest level) that have two children nodes. Based on the total number of leaf nodes, the height, the number of leaf nodes in the penultimate level, the number of nodes in the penultimate level that have two children nodes, and the total number of nodes, file generator 110 can generate a superset tree data structure for a column.

An example operation of processing a query using a superset tree data structure will now be described by reference to FIGS. 1, 4, 10, and 11. For this example, file generator 110 divided table 400 into four blocks of rows (instead of the three blocks of rows illustrated in FIG. 5) and splits the blocks of rows into fragments. FIG. 10 illustrates table 400 illustrated in FIG. 4 divided into blocks of rows according to some embodiments. As illustrated, table 400 in FIG. 10 is divided into four blocks of rows. Each block of rows includes six rows from table 400. FIG. 10 also shows column 405 separated into fragments 1005-1020 and column 410 separated into fragments 1025-1040. Fragment 1005 includes the data for column 405 in the first block of rows, fragment 1010 includes the data for column 405 in the second block of rows, fragment 1015 includes the data for column 405 in the third block of rows, and fragment 1020 includes the data for column 405 in the fourth row of blocks. Similarly, fragment 1025 includes the data for column 410 in the first block of rows, fragment 1030 includes the data for column 410 in the second block of rows, fragment 1035 includes the data for column 410 in the third block of rows, and fragment 1040 includes the data for column 410 in the fourth row of blocks.

To generate a superset tree for column 410, file generator 110 uses equations (5)-(8) provided above. Since column 410 has four fragments, file generator 110 determines that the superset tree for column 410 will have four leaf nodes. Using equation (5), file generator 110 calculates the height of the superset tree for column 410 to be two. Using equation (6), file generator 110 calculates the number of leaf nodes in the penultimate level of the superset tree for column 410 to be zero. Using equation (7), file generator 110 calculates the number of nodes in the penultimate level of the superset tree that have two children nodes to be two. Using equation (8), file generator 110 calculates the total number of nodes in the superset tree for column 410 to be seven.

Figure 11:
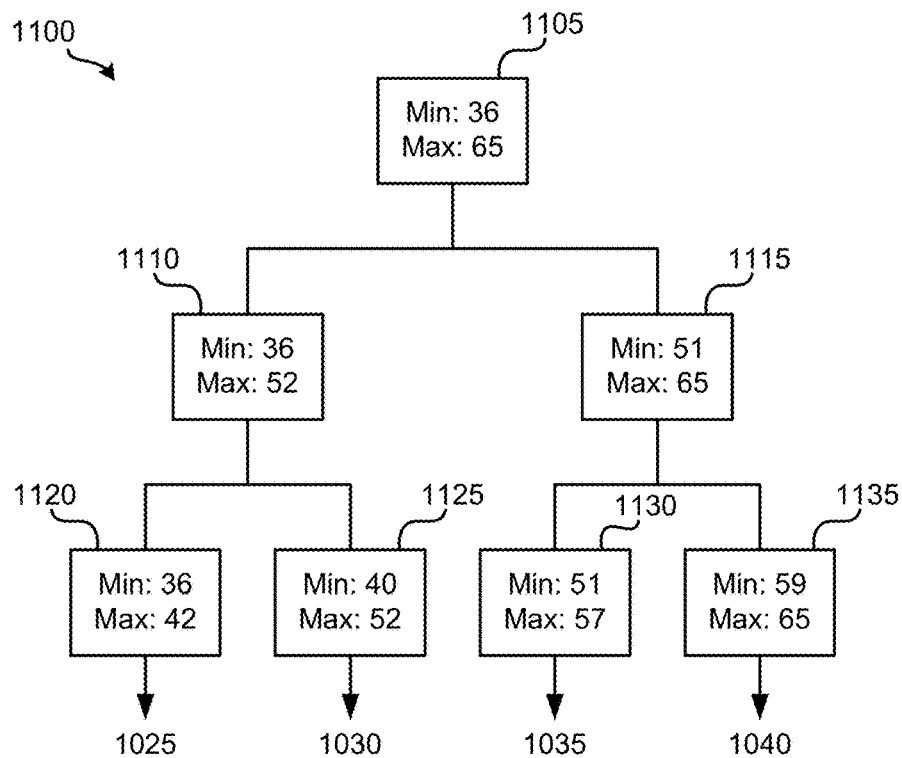
FIG. 11 illustrates a superset tree for a column illustrated in FIG. 10 according to some embodiments.

FIG. 11 illustrates a superset tree 1100 for a column illustrated in FIG. 10 according to some embodiments. In this example, file generator 110 generates superset tree 1100 for column 410. As shown, superset tree 1100 has four leaf nodes, a height of two, zero leaf nodes in the penultimate level, two nodes in the penultimate level that have two children node, and a total of seven nodes. After generating superset tree 1100, file generator 110 serializes the nodes of superset tree 1100 in breadth-first order and stores it as page of data 710b in file 700 in the same manner described above in Section I (e.g., using the format shown in FIG. 8 and layout 300).

As illustrated in FIG. 11, superset tree 1100 is a hierarchical tree data structure that is rooted, full, and complete. Superset tree 1100 includes nodes 1105-1135. Each of the node 1105-1135 stores a minimum value and a maximum value. Node 1105 is the root node and stores the minimum value and maximum value of its child nodes (i.e., nodes 1110 and 1115). Node 1110 stores the minimum value and maximum value of its child nodes (i.e., nodes 1120 and 1125). Similarly, node 1115 stores the minimum value and maximum value of its child nodes (i.e., nodes 1130 and 1135). As such, nodes 1105, 1110, and 1115 each stores a superset of its respective child nodes. Node 1120 is a leaf node that stores the minimum value and maximum value of the values in fragment 1025. Node 1125 is a leaf node that stores the minimum value and maximum value of the values in fragment 1030. Node 1130 is a leaf node that stores the minimum value and maximum value of the values in fragment 1035. Node 1135 is a leaf node that stores the minimum value and maximum value of the values in fragment 1040.

The example operation of processing a query using superset tree 1100 begins by execution manager 115 receiving a query for data stored in file 700. The query may be received from a client device (not shown), an application operating on computing system (not shown), a service or process (not shown) executing on computing system 105, or any other device, system, component, element, etc. that is able to send a query to execution manager 115. For this example, the query is for rows in table 400 where the value in column 410 is greater than 34 and less than 49.

Upon receiving the query, execution manager 115 generates an execution plan based on the query. Next, execution manager 115 sends the execution plan to execution engine 120. When execution engine 120 receives the execution plan, execution engine 120 executes the execution plan. Execution engine 120 executes the execution plan for the query in this example by instructing data import manager 125 to apply a filter on column 410 for rows in table 400 where the value in column 410 is greater than 34 and less than 49.

When data import manager 125 receives the instructions from execution engine 120, data import manager 125 instructs file reader 130 to access file 700 in files storage 135. Data import manager 125 then instructs file reader 130 to retrieve from file 700 header page 715, the page of data storing the column metadata for column 405 (i.e., page of data 710*i*), the page of data storing the column metadata for column 410 (i.e., page of data 710*j*), the page of data storing data metadata 600 for column 405 (i.e., page of data 710*a*), and the page of data storing data metadata 620 for column 410 (i.e., page of data 710*b*).

Data import manager 125 then generates superset tree 1100 based on data metadata 620 and iterates through superset tree 1100 in a breadth-first manner to determine which blocks of rows are of interest. As such, data import manager 125 starts at root node 1105. Because the range of values defined by the minimum value and the maximum value stored in node 1105 overlaps with, but is not completely inside, the range of values defined by the query, data import manager 125 determines that it needs to iterate through the child nodes of node 1105. Thus, data import manager 125 iterates to node 1110 and determines that it needs to iterate through the child nodes of node 1110 since the range of values defined by the minimum value and the maximum value stored in node 1110 overlaps with, but is not completely inside, the range of values defined by the query. When data import manager 125 iterates to node 1115, data import manager 125 determines that it can skip nodes 1130 and 1135 as the range of values defined by the minimum value and the maximum value stored in node 1115 is completely outside the range of values defined by the query. Next, data import manager 125 iterates to node 1120. Data import manager 125 determines to include all the rows in fragment 1025 in the results for the query as the range of values defined by the minimum value and the maximum value stored in node 1120 is completely inside the range of values defined by the query. Lastly, data import manager 125 iterates to node 1125 and determines that some of the rows in fragment 1030 may be included in the results for the query as the range of values defined by the minimum value and the maximum value of node 1125 overlaps with, but is not completely inside, the range of values defined by the query.

Data import manager 125 sends file reader 130 the offsets and sizes for pages of data containing fragments 1025 and 1030, which data import manager 125 retrieves from the column metadata for column 410, and instructs file reader 130 to retrieve fragments 1025 and 1030 from the respective pages of data. When data import manager 125 receives fragments 1025 and 1030, data import manager 125 identifies the rows in fragment 1030 that satisfy the query (the first and second rows in fragment 1030). Data import manager 125 then sends file reader 130 the offsets and sizes for the page of data containing fragments 1005 and 1010, which data import manager 125 retrieves from the column metadata for column 405, and instructs file reader 130 to retrieve fragments 1005 and 1010 from the respective pages of data. Next, data import manager 125 identifies the rows in fragment 1010 that correspond to the rows in fragment 1030 that satisfied the query. Data import manager 125 then includes the identified rows in fragment 1010, the identified rows in fragment 1030, all the rows in fragment 1005, and all the rows in fragment 1025 in the results for the query and sends the results for the query to execution engine 120. In response, execution engine 120 forwards the results for the query to execution manager 115, which forwards it to the element from which execution manager 115 received the query.

The example operation described above using a superset tree data structure to process a query on data stored in a format2 file demonstrates how data import manager 125 is able to eliminate/skip multiple fragments at a time based on the data stored in the superset tree data structure. Further, the superset tree data structure in the above example operation stores ranges of integer values (i.e., intervals) based on the integer values in the underlying fragments. In some embodiments, a superset tree data structure can store bloom filters that are generated based on string values stored in a column.

Figure 12:
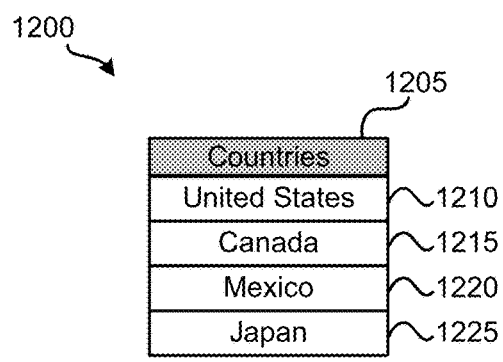
FIG. 12 illustrates an example column of a table according to some embodiments.

Another example operation of processing a query using a superset tree data structure will now be described by reference to FIGS. 1, 12, and 13. FIG. 12 illustrates an example column 1205 of a table 1200 according to some embodiments. For the purposes of simplicity and explanation, FIG. 12 shows only column 1205 of table 1200. One of ordinary skill in the art will appreciate that any number of different columns can be included in table 1200. In this example, file generator 110 divides table 1200 into four blocks of rows and splits the blocks of rows into fragments 1210-1225. Each fragment has one string value in it.

File generator 110 uses equations (5)-(8) to generate a superset tree for column 1205. Since column 410 has four fragments, file generator 110 determines that the superset tree for column 410 will have four leaf nodes. Based on equation (5), file generator 110 calculates the height of the superset tree for column 1205 to be two. Based on equation (6), file generator 110 calculates the number of leaf nodes in the penultimate level of the superset tree for column 1205 to be zero. Based on equation (7), file generator 110 calculates the number of nodes in the penultimate level of the superset tree for column 1205 that have two children nodes to be two. Based on equation (8), file generator 110 calculates the total number of nodes in the superset tree for column 1205 to be seven.

Figure 13:
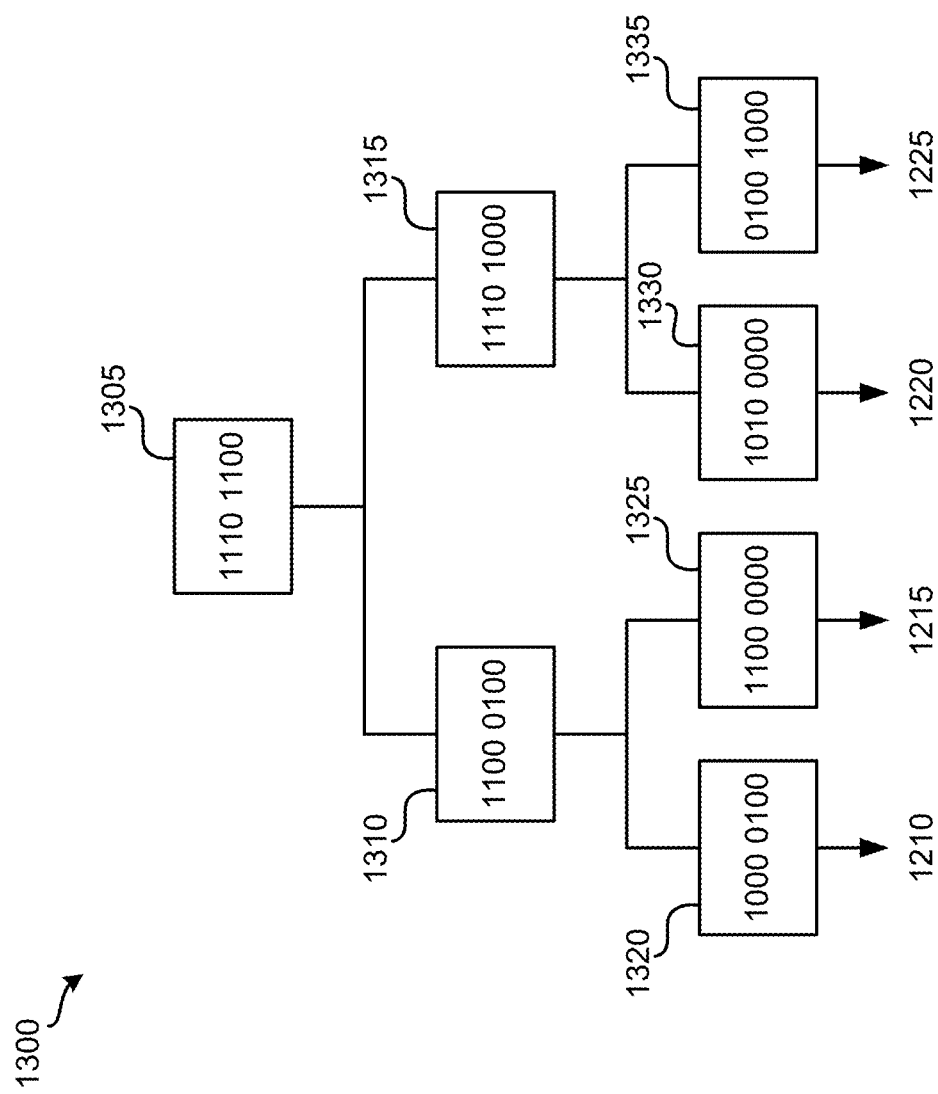
FIG. 13 illustrates a superset tree for the column illustrated in FIG. 12 according to some embodiments.

FIG. 13 illustrates a superset tree 1300 for column 1205 illustrated in FIG. 12 according to some embodiments. For this example, file generator 110 generates superset tree 1300 for column 1205. As shown, superset tree 1300 has four leaf nodes, a height of two, zero leaf nodes in the penultimate level, two nodes in the penultimate level that have two children node, and a total of seven nodes. Once superset tree 1300 is generated, file generator 110 serializes the nodes of superset tree 1300 in breadth-first order and stores it as a page of data in a format2 file in the same manner described above in Section I (e.g., using the format shown in FIG. 8 and layout 300).

As shown in FIG. 13, superset tree 3100 is a hierarchical tree data structure that is rooted, full, and complete. Superset tree 1300 includes nodes 1305-1335. Each of the node 1305-1335 stores a bloom filter. Node 1305 is the root node and stores a bloom filter that is a combination of the bloom filters of its child nodes (i.e., nodes 1310 and 1315). File generator 110 generates the bloom filter for node 1305 by performing a bitwise OR operation on the bloom filters of the child nodes of node 1305. Node 1310 stores a bloom filter that is a combination of the bloom filters of its child nodes (i.e., nodes 1320 and 1325). File generator 110 generates the bloom filter for node 1310 by performing a bitwise OR operation on the bloom filters of the child nodes of node 1315. Similarly, node 1315 stores a bloom filter that is a combination of the bloom filters of its child nodes (i.e., nodes 1330 and 1335). File generator 110 generates the bloom filter for node 1315 by performing a bitwise OR operation on the bloom filters of the child nodes of node 1315. As such, nodes 1305, 1310, and 1315 each stores a superset of its respective child nodes.

Node 1320 is a leaf node that stores a bloom filter based on the values in fragment 1210. In this example, the bloom filters are 8-bit bit arrays configured to store hash values from two hash functions. Any number of different hash functions may be used. Examples of hash functions include a Fowler-Noll-Vo (FNV) hash function, a Murmur hash function, a Jenkins hash function, etc. The two hash functions generated values "1" and "6" from the string "United States". As such, the first and sixth bits in the bloom filter for node 1320 are set to "1". Next, the two hash functions generated values "1" and "2" from the string "Canada". Thus, the first and second bits in the bloom filter for node 1325 are set to "1". The two hash functions generated values "1" and "3" from the string "Mexico". Accordingly, the first and third bits in the bloom filter for node 1330 are set to "1". The two hash functions generated values "2" and "5" from the string "Japan". Hence, the second and fifth bits in the bloom filter for node 1335 are set to "1".

The example operation of processing a query using superset tree 1300 begins by execution manager 115 receiving a query for data stored in a format2 file that contains data for column 1205. The query may be received from a client device (not shown), an application operating on computing system (not shown), a service or process (not shown) executing on computing system 105, or any other device, system, component, element, etc. that is able to send a query to execution manager 115. In this example, the query is for rows in table 1200 with column 1205 where the value in column 1205 is equal to the string "United States".

After receiving the query, execution manager 115 generates an execution plan based on the query. Execution manager 115 then sends the execution plan to execution engine 120. Upon receiving the execution plan, execution engine 120 executes the execution plan. To execute the execution plan for the query in this example, execution engine 120 instructs data import manager 125 to apply a filter on column 1205 for rows in table 1200 where the value has a string value equal to "United States". In response to the instructions, data import manager 125 instructs file reader 130 to access the format2 file stored in files storage 135 that stores table 1200. Next, data import manager 125 instructs file reader 130 to retrieve the header page, the page of data storing the column metadata for column 1205, and the page of data storing data metadata for column 1205 from the file.

Then, data import manager 125 generates superset tree 1300 based on the data metadata for column 1205. In addition, data import manager 125 uses the same two hash functions used generating the bloom filters for superset tree 1300 to generate a bloom filter based on the string in the query (also referred to as the query bloom filter). The two hash functions generated values "1" and "6" from the string "United States" specified in the query. Therefore, the first and sixth bits in the query bloom filter are set to "1" (i.e., 1000 0100).

Next, data import manager 125 starts iterating through superset tree 1300 in a breadth-first manner to determine which blocks of rows are of interest. Data import manager 125 begins at root node 1305. Data import manager 125 compares the query bloom filter with the bloom filter stored in node 1305. Since all the bits set to "1" in the query bloom filter are also set to "1" in the bloom filter stored in node 1305, data import manager determines that it needs to iterate through the child nodes of node 1305. Data import manager 125 iterates to node 1310 and compares the query bloom filter with the bloom filter stored in node 1310. The first and sixth bits of the bloom filter stored in node 1310 are also set to "1". Hence, data import manager 125 determines that it needs to iterate through the child nodes of node 1310. After iterating to node 1315, data import manager 125 compares the query bloom filter with the bloom filter stored in node 1315. Since the sixth bit in the bloom filter stored in node 1315 is not set to "1", data import manager 125 determines that it can skip nodes 1330 and 1335. Data import manager 125 then iterates to node 1320 and compares the query bloom filter with the bloom filter stored in node 1320. Because the first and sixth bits in the bloom filter stored in node 1320, data import manager 125 determines that fragment 1210 can possibly have rows that match the query. Next, data import manager 125 iterates to node 1325 and compares the query bloom filter with the bloom filter stored in node 1325. As the sixth bit in the bloom filter stored in node 1325 is not set to "1", data import manager 125 determines that it can skip node 1325.

Data import manager 125 sends file reader 130 the offset and size for pages of data containing fragment 1210, which data import manager 125 retrieves from the column metadata for column 1205, and instructs file reader 130 to retrieve fragment 1210 from the respective page of data. Upon receiving fragment 1210, data import manager 125 identifies the rows in fragment 1210 that satisfy the query (the first and only row in fragment 1210). Data import manager 125 includes the identified rows in fragment 1210 in the results for the query and sends the results for the query to execution engine 120, which forwards it to execution manager 115. In response, execution manager 115 forwards the results for the query to the element from which execution manager 115 received the query.

Figure 14:
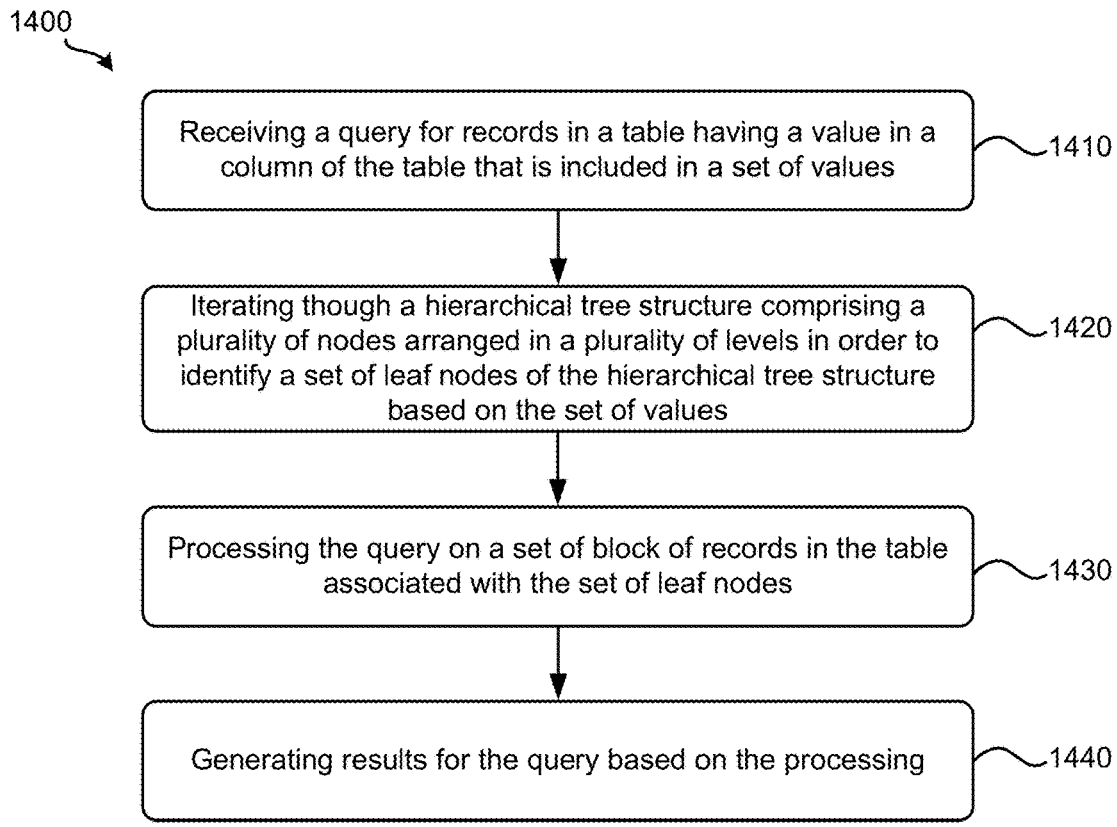
FIG. 14 illustrates a process for processing queries using superset trees according to some embodiments.

FIG. 14 illustrates a process 1400 for processing queries using superset trees according to some embodiments. In some embodiments, computing system 105 performs process 1400. Process 1400 starts by receiving, at 1410, a query for records in a table having a value in a column of the table that is included in a set of values. Referring to FIGS. 1 and 10 and the operation described above as an example, execution manager 115 may receive a query for records in table 400 of FIG. 10 that have a value in column 410 greater than 34 and less than 49.

Next, process 1400 iterates, at 1420, though a hierarchical tree structure that includes a plurality of nodes arranged in a plurality of levels in order to identify a set of leaf nodes of the hierarchical tree structure based on the set of values. Each leaf node in the hierarchical tree structure may be associated with a block of records in the table. Each leaf node in the hierarchical tree structure can include data describing a superset of values in the column of the block of records associated with the leaf node. Each non-leaf node can include data describing a superset of the values described by the data in child nodes of the non-leaf node. Referring to FIGS. 1 and 11 and the operation described above as an example, data import manager 125 may iterate though superset tree 1100 to identify leaf nodes (e.g., node 1120, node 1125, node 1130, and/or node 1135) that may include records that satisfy the query.

Process 1400 then processes, at 1430, the query on a set of block of records in the table associated with the set of leaf nodes. Referring to FIGS. 1 and 10 and the operation described above as an example, data import manager 125 determines to include all the rows in fragment 1025 and that some of the rows in fragment 1030 may be included in the results for the query. In particular, data import manager 125 identifies the rows in fragment 1030 that satisfy the query (the first and second rows in fragment 1030). Finally, process 1400 generates, at 1440, results for the query based on the processing. Referring to FIG. 1 and the operation described above as an example, data import manager 125 includes all rows in fragment 1025 and the identified rows in fragment 1030 in the results of the query (along with the corresponding rows in column 405).

III. Floating Point Data Compression Scheme

Figure 15:
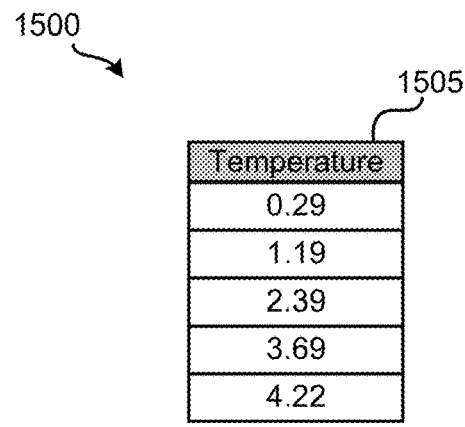
FIG. 15 illustrates an example table of floating point values according to some embodiments.
Figure 16:
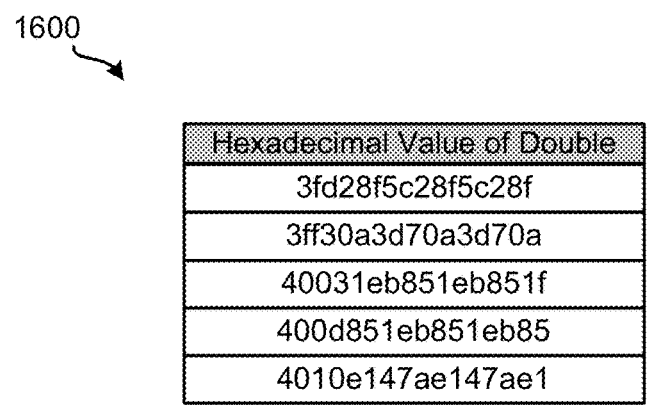
FIG. 16 illustrates hexadecimal representations of the floating point values illustrated in FIG. 15 according to some embodiments.

Section I discusses different methods for encoding a sequence of integer values, string values, etc. In some cases, a column in a table stores floating point values. Computing system 105 uses a novel technique for encoding sequences of floating point values. An example operation of encoding a sequence of floating point values will now be described by reference to FIGS. 1, 15, and 16. FIG. 15 illustrates an example table 1500 of floating point values according to some embodiments. As shown, table 1500 includes a column 1505 and five rows of data. For the purposes of simplicity and explanation, FIG. 15 shows only column 1505 of table 1500. One of ordinary skill in the art will appreciate that any number of different columns can be included in table 1500. Column 1505 is configured to store floating point values that represent temperatures (Fahrenheit). In some embodiments, the floating point values to be encoded are stored at 64-bit floating point values (e.g., Institute of Electrical and Electronics Engineers (IEEE) 64-bit floating point values). FIG. 16 illustrates hexadecimal representations of the floating point values illustrated in FIG. 15 according to some embodiments. Specifically, FIG. 16 shows a table 1600 that includes hexadecimal values of IEEE 64-bit floating point values (e.g., doubles) that correspond to the floating point values in table 1500.

Figure 17:
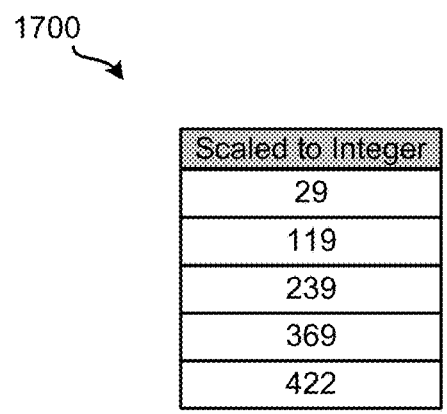
FIG. 17 illustrates scaled integer representations of the floating point values illustrated in FIG. 15 according to some embodiments.

The example operation starts by file generator 110 receiving a request to store table 1500 in a format2 file. File generator 110 generates the format2 file for table 1500 in a similar manner as that described above in Section I. To encode the floating point values in column 1505, file generator 110 determines a scale value for scaling the floating point values to the lowest range of integer values. In some embodiments, the scale value is a power of 10. In this example, file generator 110 determines a scale value by multiplying each of the values in column 1505 by 10 to the first power and checking whether all the multiplied values are integers. If not, file generator 110 continues to multiply each of the values in column 1505 with increasing powers of 10 until the multiplied values in column 1505 are integers. That is, file generator 110 multiplies each of the values in column 1505 by 10 to the second power and checking whether all the multiplied values are integers, multiplies each of the values in column 1505 by 10 to the third power and checking whether all the multiplied values are integers, etc. For this example, file generator 110 determines the scale value to be 100 since multiplying each value in column 1505 by 100 produces all integer values. Once file generator 110 determines the scale value, file generator 110 multiplies each floating point value in column 1505 by the scale value and converts the scaled floating point values to integer representations of the scaled floating point values. FIG. 17 illustrates scaled integer representations of the floating point values illustrated in FIG. 15 according to some embodiments. In particular, FIG. 17 shows a table 1700 that includes the integer values of the corresponding floating point values in table 1500 after file generator 110 has scaled the floating point values and converted them to integer values.

In this example, nine bits are need to encode all the integer values in table 1700. In some embodiments, negative values can be accounted for by using one bit for a sign bit. In other embodiments, negative values can be accounted for by using zigzag encoding, which also uses an additional bit. Nevertheless, file generator 110 determines that one additional bit to account for negative values is needed to store the integer values in table 1700. Thus, file generator 110 determines that ten bits are need to store each integer value in table 1700. File generator 110 also stores the scale value in the format2 file.

As noted above, the scale value is a power of 10 in some embodiments. Hence, in some such embodiments, file generator 110 uses an 8-bit integer to store an exponent integer that produces the scale value when the value 10 is raised to the exponent integer. Storing a scale value in such a manner allows for scale values ranging from $10^{-127}$ to $10^{127}$. The exponent integer value of −128 is reserved for cases where no valid scale can be found in the range −127 to 127 or for cases where the compression is not effective. The compression is determined to be not effective when the compressed data is less than a threshold ratio value (e.g., 85%, 90%, 95%, etc.) of the original size of the data. In this example, the total number of bits used to store the floating point values is 8-bits+(N*9-bits), where N is the number of rows in table 1700. Thus, 53 bits are needed to store the floating point values in table 1700. Compared to the amount of bits needed to store the floating point values as 64-bit floating point values, that results in a compression ratio of approximately 6.037 (5*64-bits: 53 bits). Comparing the amount of bytes need to store the compressed floating point values and the uncompressed floating point values results in results in a compression ratio of approximately 5.714 (40 bytes: 7 bytes).

In some embodiments, file generator 110 encodes the integer values in table 1700 using an integer encoding scheme. In some such embodiments, file generator 110 encodes the integer values using the automatic integer encoding scheme selection technique explained above in Section I. Finally, file generator 110 stores encoded integer values in a page of data of a format2 file in a similar manner described above in Section I (e.g., using the format shown in FIG. 8 and layout 300).

In some instances, computing system 105 can receive a query on table 1500 and needs to access the data in column 1505. In such instances, data import manager 125 instructs file reader 130 to retrieve the file containing table 1500 from file storage 135. If an integer encoding scheme was used to encode the integer values, data import manager 125 uses it to decode the integer values. Then, data import manager 125 converts the integer values to floating point representations of the integer values. Next, data import manager 125 calculates the scale value by extracting the integer exponent and raising the value 10 to the power of the integer exponent. Data import manager 125 uses the calculated scale value to unscale the floating point values by multiplying each floating point value by the calculated scale value. The resulting floating point values are the original values in table 1500. Finally, data import manager 125 processes the query on the resulting floating point values.

Figure 18:
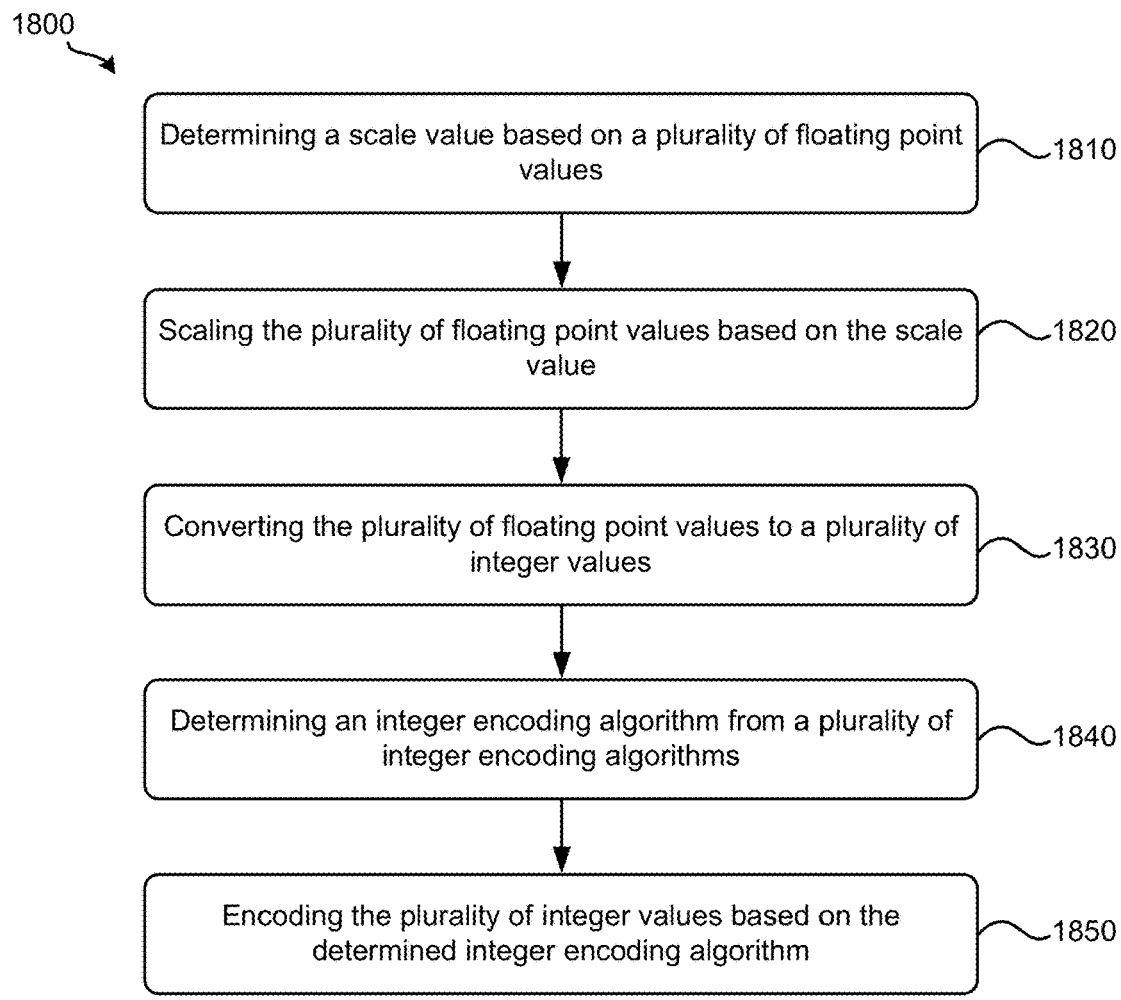
FIG. 18 illustrates a process for compressing floating point values according to some embodiments.

FIG. 18 illustrates a process 1800 for compressing floating point values according to some embodiments. In some embodiments, file generator 110 performs process 1800. Process 1800 begins by determining, at 1810, a scale value based on a plurality of floating point values. Next, process 1800 scales, at 1820, the plurality of floating point values based on the scale value. Process 1800 can scale the plurality of floating point values by multiplying each floating point value by the scale value.

Process 1800 then converts, at 1830, the plurality of floating point values to a plurality of integer values. That is, process 1800 converts each floating point value to an integer representation of the scaled floating point value. Next, process 1800 determines, at 1840, an integer encoding scheme from a plurality of integer encoding schemes. In some embodiments, process 1800 uses the automatic integer encoding scheme selection technique described in Section I to determine the integer encoding scheme. Finally, process 1800 encodes, at 1850, the plurality of integer values based on the determined integer encoding algorithm.

Figure 19:
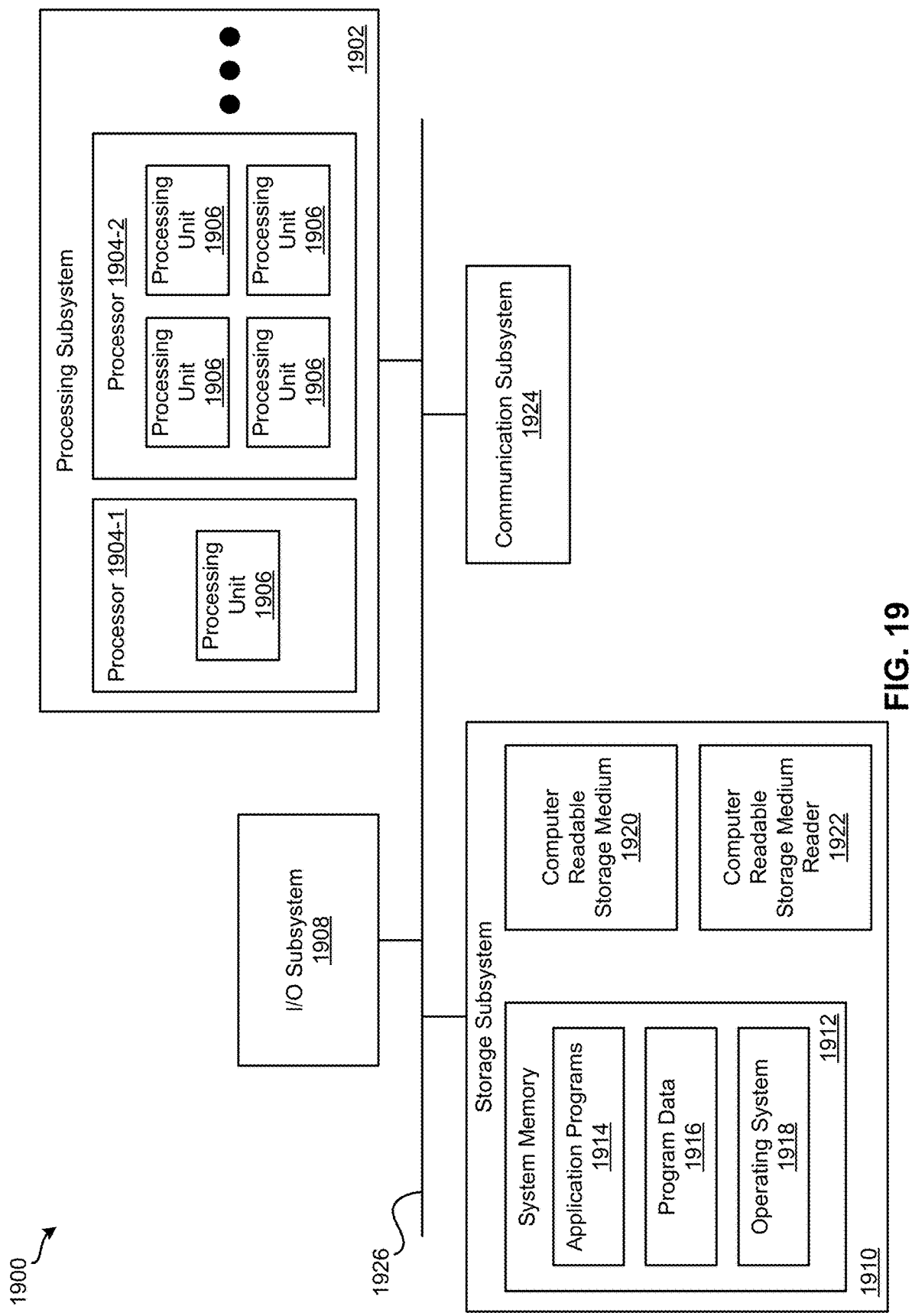
FIG. 19 illustrates an exemplary computer system, in which various embodiments may be implemented.

FIG. 19 illustrates an exemplary computer system 1900 for implementing various embodiments described above. For example, computer system 1900 may be used to implement computing system 105. Computer system 1900 may be a desktop computer, a laptop, a server computer, or any other type of computer system or combination thereof. Some or all elements of file generator 110, execution manager 115, execution engine 120, data import manager 125, file reader 130, or combinations thereof can be included or implemented in computer system 1900. In addition, computer system 1900 can implement many of the operations, methods, and/or processes described above (e.g., process 900, process 1400, and process 1800). As shown in FIG. 19, computer system 1900 includes processing subsystem 1902, which communicates, via bus subsystem 1926, with input/output (I/O) subsystem 1908, storage subsystem 1910 and communication subsystem 1924.

Bus subsystem 1926 is configured to facilitate communication among the various components and subsystems of computer system 1900. While bus subsystem 1926 is illustrated in FIG. 19 as a single bus, one of ordinary skill in the art will understand that bus subsystem 1926 may be implemented as multiple buses. Bus subsystem 1926 may be any of several types of bus structures (e.g., a memory bus or memory controller, a peripheral bus, a local bus, etc.) using any of a variety of bus architectures. Examples of bus architectures may include an Industry Standard Architecture (ISA) bus, a Micro Channel Architecture (MCA) bus, an Enhanced ISA (EISA) bus, a Video Electronics Standards Association (VESA) local bus, a Peripheral Component Interconnect (PCI) bus, a Universal Serial Bus (USB), etc.

Processing subsystem 1902, which can be implemented as one or more integrated circuits (e.g., a conventional microprocessor or microcontroller), controls the operation of computer system 1900. Processing subsystem 1902 may include one or more processors 1904. Each processor 1904 may include one processing unit 1906 (e.g., a single core processor such as processor 1904-1) or several processing units 1906 (e.g., a multicore processor such as processor 1904-2). In some embodiments, processors 1904 of processing subsystem 1902 may be implemented as independent processors while, in other embodiments, processors 1904 of processing subsystem 1902 may be implemented as multiple processors integrate into a single chip or multiple chips. Still, in some embodiments, processors 1904 of processing subsystem 1902 may be implemented as a combination of independent processors and multiple processors integrated into a single chip or multiple chips.

In some embodiments, processing subsystem 1902 can execute a variety of programs or processes in response to program code and can maintain multiple concurrently executing programs or processes. At any given time, some or all of the program code to be executed can reside in processing subsystem 1902 and/or in storage subsystem 1910. Through suitable programming, processing subsystem 1902 can provide various functionalities, such as the functionalities described above by reference to process 900, process 1400, process 1800, etc.

I/O subsystem 1908 may include any number of user interface input devices and/or user interface output devices. User interface input devices may include a keyboard, pointing devices (e.g., a mouse, a trackball, etc.), a touchpad, a touch screen incorporated into a display, a scroll wheel, a click wheel, a dial, a button, a switch, a keypad, audio input devices with voice recognition systems, microphones, image/video capture devices (e.g., webcams, image scanners, barcode readers, etc.), motion sensing devices, gesture recognition devices, eye gesture (e.g., blinking) recognition devices, biometric input devices, and/or any other types of input devices.

User interface output devices may include visual output devices (e.g., a display subsystem, indicator lights, etc.), audio output devices (e.g., speakers, headphones, etc.), etc. Examples of a display subsystem may include a cathode ray tube (CRT), a flat-panel device (e.g., a liquid crystal display (LCD), a plasma display, etc.), a projection device, a touch screen, and/or any other types of devices and mechanisms for outputting information from computer system 1900 to a user or another device (e.g., a printer).

As illustrated in FIG. 19, storage subsystem 1910 includes system memory 1912, computer-readable storage medium 1920, and computer-readable storage medium reader 1922. System memory 1912 may be configured to store software in the form of program instructions that are loadable and executable by processing subsystem 1902 as well as data generated during the execution of program instructions. In some embodiments, system memory 1912 may include volatile memory (e.g., random access memory (RAM)) and/or non-volatile memory (e.g., read-only memory (ROM), programmable read-only memory (PROM), erasable programmable read-only memory (EPROM), electrically erasable programmable read-only memory (EEPROM), flash memory, etc.). System memory 1912 may include different types of memory, such as static random access memory (SRAM) and/or dynamic random access memory (DRAM). System memory 1912 may include a basic input/output system (BIOS), in some embodiments, that is configured to store basic routines to facilitate transferring information between elements within computer system 1900 (e.g., during start-up). Such a BIOS may be stored in ROM (e.g., a ROM chip), flash memory, or any other type of memory that may be configured to store the BIOS.

As shown in FIG. 19, system memory 1912 includes application programs 1914, program data 1916, and operating system (OS) 1918. OS 1918 may be one of various versions of Microsoft Windows, Apple Mac OS, Apple OS X, Apple macOS, and/or Linux operating systems, a variety of commercially-available UNIX or UNIX-like operating systems (including without limitation the variety of GNU/Linux operating systems, the Google Chrome® OS, and the like) and/or mobile operating systems such as Apple iOS, Windows Phone, Windows Mobile, Android, BlackBerry OS, Blackberry 10, and Palm OS, WebOS operating systems.

Computer-readable storage medium 1920 may be a non-transitory computer-readable medium configured to store software (e.g., programs, code modules, data constructs, instructions, etc.). Many of the components (e.g., file generator 110, execution manager 115, execution engine 120, data import manager 125, and file reader 130) and/or processes (e.g., process 900, process 1400, and process 1800) described above may be implemented as software that when executed by a processor or processing unit (e.g., a processor or processing unit of processing subsystem 1902) performs the operations of such components and/or processes. Storage subsystem 1910 may also store data used for, or generated during, the execution of the software.

Storage subsystem 1910 may also include computer-readable storage medium reader 1922 that is configured to communicate with computer-readable storage medium 1920. Together and, optionally, in combination with system memory 1912, computer-readable storage medium 1920 may comprehensively represent remote, local, fixed, and/or removable storage devices plus storage media for temporarily and/or more permanently containing, storing, transmitting, and retrieving computer-readable information.

Computer-readable storage medium 1920 may be any appropriate media known or used in the art, including storage media such as volatile, non-volatile, removable, non-removable media implemented in any method or technology for storage and/or transmission of information. Examples of such storage media includes RAM, ROM, EEPROM, flash memory or other memory technology, compact disc read-only memory (CD-ROM), digital versatile disk (DVD), Blu-ray Disc (BD), magnetic cassettes, magnetic tape, magnetic disk storage (e.g., hard disk drives), Zip drives, solid-state drives (SSD), flash memory card (e.g., secure digital (SD) cards, CompactFlash cards, etc.), USB flash drives, or any other type of computer-readable storage media or device.

Communication subsystem 1924 serves as an interface for receiving data from, and transmitting data to, other devices, computer systems, and networks. For example, communication subsystem 1924 may allow computer system 1900 to connect to one or more devices via a network (e.g., a personal area network (PAN), a local area network (LAN), a storage area network (SAN), a campus area network (CAN), a metropolitan area network (MAN), a wide area network (WAN), a global area network (GAN), an intranet, the Internet, a network of any number of different types of networks, etc.). Communication subsystem 1924 can include any number of different communication components. Examples of such components may include radio frequency (RF) transceiver components for accessing wireless voice and/or data networks (e.g., using cellular technologies such as 2G, 3G, 4G, 5G, etc., wireless data technologies such as Wi-Fi, Bluetooth, ZigBee, etc., or any combination thereof), global positioning system (GPS) receiver components, and/or other components. In some embodiments, communication subsystem 1924 may provide components configured for wired communication (e.g., Ethernet) in addition to or instead of components configured for wireless communication.

One of ordinary skill in the art will realize that the architecture shown in FIG. 19 is only an example architecture of computer system 1900, and that computer system 1900 may have additional or fewer components than shown, or a different configuration of components. The various components shown in FIG. 19 may be implemented in hardware, software, firmware or any combination thereof, including one or more signal processing and/or application specific integrated circuits.

Figure 20:
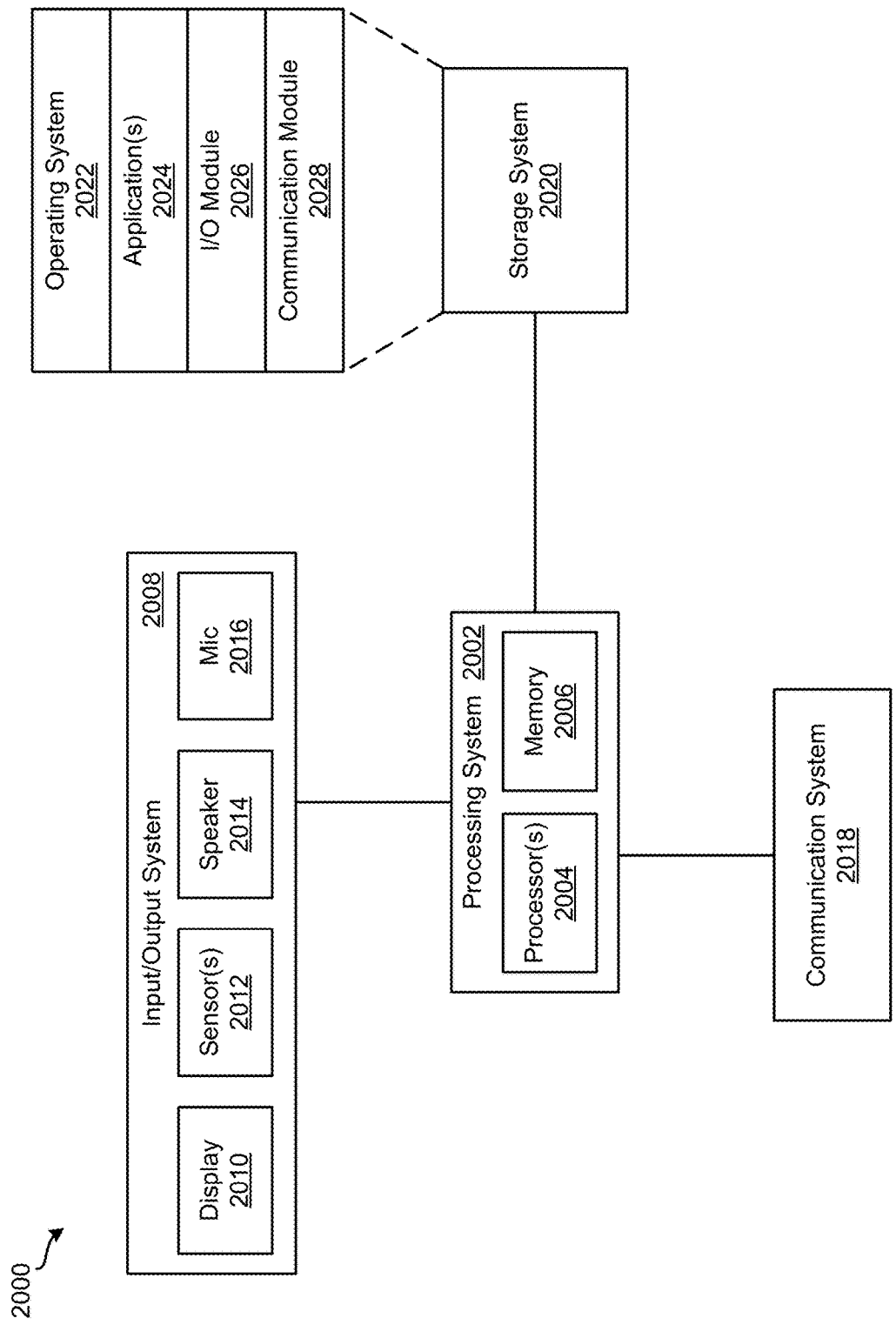
FIG. 20 illustrates an exemplary computing device, in which various embodiments may be implemented.

FIG. 20 illustrates an exemplary computing device 2000 for implementing various embodiments described above. For example, computing device 2000 may be used to implement computing system 105. Computing device 2000 may be a cellphone, a smartphone, a wearable device, an activity tracker or manager, a tablet, a personal digital assistant (PDA), a media player, or any other type of mobile computing device or combination thereof. Some or all elements of file generator 110, execution manager 115, execution engine 120, data import manager 125, file reader 130, or combinations thereof can be included or implemented in computing device 2000. In addition, computing device 2000 can implement many of the operations, methods, and/or processes described above (e.g., process 900, process 1400, and process 1800). As shown in FIG. 20, computing device 2000 includes processing system 2002, input/output (I/O) system 2008, communication system 2018, and storage system 2020. These components may be coupled by one or more communication buses or signal lines.

Processing system 2002, which can be implemented as one or more integrated circuits (e.g., a conventional microprocessor or microcontroller), controls the operation of computing device 2000. As shown, processing system 2002 includes one or more processors 2004 and memory 2006. Processors 2004 are configured to run or execute various software and/or sets of instructions stored in memory 2006 to perform various functions for computing device 2000 and to process data.

Each processor of processors 2004 may include one processing unit (e.g., a single core processor) or several processing units (e.g., a multicore processor). In some embodiments, processors 2004 of processing system 2002 may be implemented as independent processors while, in other embodiments, processors 2004 of processing system 2002 may be implemented as multiple processors integrate into a single chip. Still, in some embodiments, processors 2004 of processing system 2002 may be implemented as a combination of independent processors and multiple processors integrated into a single chip.

Memory 2006 may be configured to receive and store software (e.g., operating system 2022, applications 2024, I/O module 2026, communication module 2028, etc. from storage system 2020) in the form of program instructions that are loadable and executable by processors 2004 as well as data generated during the execution of program instructions. In some embodiments, memory 2006 may include volatile memory (e.g., random access memory (RAM)), non-volatile memory (e.g., read-only memory (ROM), programmable read-only memory (PROM), erasable programmable read-only memory (EPROM), electrically erasable programmable read-only memory (EEPROM), flash memory, etc.), or a combination thereof.

I/O system 2008 is responsible for receiving input through various components and providing output through various components. As shown for this example, I/O system 2008 includes display 2010, one or more sensors 2012, speaker 2014, and microphone 2016. Display 2010 is configured to output visual information (e.g., a graphical user interface (GUI) generated and/or rendered by processors 2004). In some embodiments, display 2010 is a touch screen that is configured to also receive touch-based input. Display 2010 may be implemented using liquid crystal display (LCD) technology, light-emitting diode (LED) technology, organic LED (OLED) technology, organic electro luminescence (OEL) technology, or any other type of display technologies. Sensors 2012 may include any number of different types of sensors for measuring a physical quantity (e.g., temperature, force, pressure, acceleration, orientation, light, radiation, etc.). Speaker 2014 is configured to output audio information and microphone 2016 is configured to receive audio input. One of ordinary skill in the art will appreciate that I/O system 2008 may include any number of additional, fewer, and/or different components. For instance, I/O system 2008 may include a keypad or keyboard for receiving input, a port for transmitting data, receiving data and/or power, and/or communicating with another device or component, an image capture component for capturing photos and/or videos, etc.

Communication system 2018 serves as an interface for receiving data from, and transmitting data to, other devices, computer systems, and networks. For example, communication system 2018 may allow computing device 2000 to connect to one or more devices via a network (e.g., a personal area network (PAN), a local area network (LAN), a storage area network (SAN), a campus area network (CAN), a metropolitan area network (MAN), a wide area network (WAN), a global area network (GAN), an intranet, the Internet, a network of any number of different types of networks, etc.). Communication system 2018 can include any number of different communication components. Examples of such components may include radio frequency (RF) transceiver components for accessing wireless voice and/or data networks (e.g., using cellular technologies such as 2G, 3G, 4G, 5G, etc., wireless data technologies such as Wi-Fi, Bluetooth, ZigBee, etc., or any combination thereof), global positioning system (GPS) receiver components, and/ or other components. In some embodiments, communication system 2018 may provide components configured for wired communication (e.g., Ethernet) in addition to or instead of components configured for wireless communication.

Storage system 2020 handles the storage and management of data for computing device 2000. Storage system 2020 may be implemented by one or more non-transitory machine-readable mediums that are configured to store software (e.g., programs, code modules, data constructs, instructions, etc.) and store data used for, or generated during, the execution of the software. Many of the components (e.g., file generator 110, execution manager 115, execution engine 120, data import manager 125, and file reader 130) and/or processes (e.g., process 900, process 1400, and process 1800) described above may be implemented as software that when executed by a processor or processing unit (e.g., processors 2004 of processing system 2002) performs the operations of such components and/or processes.

In this example, storage system 2020 includes operating system 2022, one or more applications 2024, I/O module 2026, and communication module 2028. Operating system 2022 includes various procedures, sets of instructions, software components and/or drivers for controlling and managing general system tasks (e.g., memory management, storage device control, power management, etc.) and facilitates communication between various hardware and software components. Operating system 2022 may be one of various versions of Microsoft Windows, Apple Mac OS, Apple OS X, Apple macOS, and/or Linux operating systems, a variety of commercially-available UNIX or UNIX-like operating systems (including without limitation the variety of GNU/ Linux operating systems, the Google Chrome® OS, and the like) and/or mobile operating systems such as Apple iOS, Windows Phone, Windows Mobile, Android, BlackBerry OS, Blackberry 10, and Palm OS, WebOS operating systems.

Applications 2024 can include any number of different applications installed on computing device 2000. Examples of such applications may include a browser application, an address book application, a contact list application, an email application, an instant messaging application, a word processing application, JAVA-enabled applications, an encryption application, a digital rights management application, a voice recognition application, location determination application, a mapping application, a music player application, etc.

I/O module 2026 manages information received via input components (e.g., display 2010, sensors 2012, and microphone 2016) and information to be outputted via output components (e.g., display 2010 and speaker 2014). Communication module 2028 facilitates communication with other devices via communication system 2018 and includes various software components for handling data received from communication system 2018.

One of ordinary skill in the art will realize that the architecture shown in FIG. 20 is only an example architecture of computing device 2000, and that computing device 2000 may have additional or fewer components than shown, or a different configuration of components. The various components shown in FIG. 20 may be implemented in hardware, software, firmware or any combination thereof, including one or more signal processing and/or application specific integrated circuits.

Figure 21:
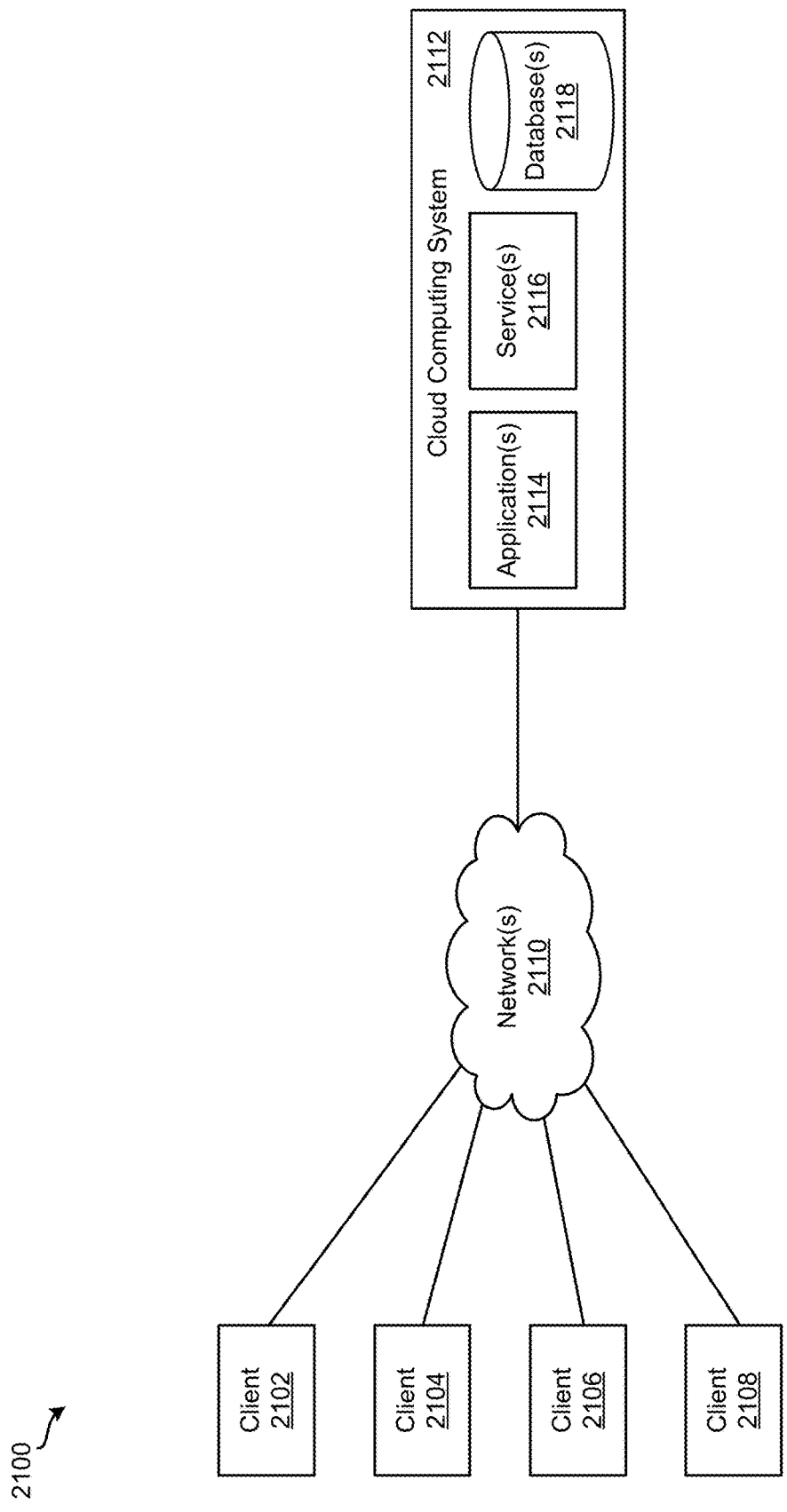
FIG. 21 illustrates an exemplary system, in which various embodiments may be implemented.

FIG. 21 illustrates an exemplary system 2100 for implementing various embodiments described above. For example, cloud computing system 2112 of system 2100 may be used to implement computing system 105. As shown, system 2100 includes client devices 2102-2108, one or more networks 2110, and cloud computing system 2112. Cloud computing system 2112 is configured to provide resources and data to client devices 2102-2108 via networks 2110. In some embodiments, cloud computing system 2100 provides resources to any number of different users (e.g., customers, tenants, organizations, etc.). Cloud computing system 2112 may be implemented by one or more computer systems (e.g., servers), virtual machines operating on a computer system, or a combination thereof.

As shown, cloud computing system 2112 includes one or more applications 2114, one or more services 2116, and one or more databases 2118. Cloud computing system 2100 may provide applications 2114, services 2116, and databases 2118 to any number of different customers in a self-service, subscription-based, elastically scalable, reliable, highly available, and secure manner.

In some embodiments, cloud computing system 2100 may be adapted to automatically provision, manage, and track a customer's subscriptions to services offered by cloud computing system 2100. Cloud computing system 2100 may provide cloud services via different deployment models. For example, cloud services may be provided under a public cloud model in which cloud computing system 2100 is owned by an organization selling cloud services and the cloud services are made available to the general public or different industry enterprises. As another example, cloud services may be provided under a private cloud model in which cloud computing system 2100 is operated solely for a single organization and may provide cloud services for one or more entities within the organization. The cloud services may also be provided under a community cloud model in which cloud computing system 2100 and the cloud services provided by cloud computing system 2100 are shared by several organizations in a related community. The cloud services may also be provided under a hybrid cloud model, which is a combination of two or more of the aforementioned different models.

In some instances, any one of applications 2114, services 2116, and databases 2118 made available to client devices 2102-2108 via networks 2110 from cloud computing system 2100 is referred to as a "cloud service." Typically, servers and systems that make up cloud computing system 2100 are different from the on-premises servers and systems of a customer. For example, cloud computing system 2100 may host an application and a user of one of client devices 2102-2108 may order and use the application via networks 2110.

Applications 2114 may include software applications that are configured to execute on cloud computing system 2112 (e.g., a computer system or a virtual machine operating on a computer system) and be accessed, controlled, managed, etc. via client devices 2102-2108. In some embodiments, applications 2114 may include server applications and/or mid-tier applications (e.g., HTTP (hypertext transport protocol) server applications, FTP (file transfer protocol) server applications, CGI (common gateway interface) server applications, JAVA server applications, etc.). Services 2116 are software components, modules, application, etc. that are configured to execute on cloud computing system 2112 and provide functionalities to client devices 2102-2108 via networks 2110. Services 2116 may be web-based services or on-demand cloud services.

Databases 2118 are configured to store and/or manage data that is accessed by applications 2114, services 2116, and/or client devices 2102-2108. For instance, database 135 may be stored in databases 2118. Databases 2118 may reside on a non-transitory storage medium local to (and/or resident in) cloud computing system 2112, in a storage-area network (SAN), on a non-transitory storage medium local located remotely from cloud computing system 2112. In some embodiments, databases 2118 may include relational databases that are managed by a relational database management system (RDBMS). Databases 2118 may be a column-oriented databases, row-oriented databases, or a combination thereof. In some embodiments, some or all of databases 2118 are in-memory databases. That is, in some such embodiments, data for databases 2118 are stored and managed in memory (e.g., random access memory (RAM)).

Client devices 2102-2108 are configured to execute and operate a client application (e.g., a web browser, a proprietary client application, etc.) that communicates with applications 2114, services 2116, and/or databases 2118 via networks 2110. This way, client devices 2102-2108 may access the various functionalities provided by applications 2114, services 2116, and databases 2118 while applications 2114, services 2116, and databases 2118 are operating (e.g., hosted) on cloud computing system 2100. Client devices 2102-2108 may be computer system 1900 or computing device 2000, as described above by reference to FIGS. 19 and 20, respectively. Although system 2100 is shown with four client devices, any number of client devices may be supported.

Networks 2110 may be any type of network configured to facilitate data communications among client devices 2102-2108 and cloud computing system 2112 using any of a variety of network protocols. Networks 2110 may be a personal area network (PAN), a local area network (LAN), a storage area network (SAN), a campus area network (CAN), a metropolitan area network (MAN), a wide area network (WAN), a global area network (GAN), an intranet, the Internet, a network of any number of different types of networks, etc.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A non-transitory machine-readable medium storing a program executable by at least one processing unit of a device, the program comprising sets of instructions for:
   determining a scale value based on a plurality of floating point values, the scale value being a value that when multiplied with each of the floating point values produces integers, said determining the scale value comprising:
      multiplying each of the plurality of floating point values by a first value and checking if each product is an integer, and
      when each product is not an integer, multiplying each of the floating point values by a second value and checking if each product is an integer;
   scaling the plurality of floating point values based on the scale value;
   converting the plurality of floating point values to a plurality of integer values;
   determining an integer encoding scheme from a plurality of integer encoding schemes; and
   encoding the plurality of integer values based on the determined integer encoding scheme.

2. The non-transitory machine-readable medium of claim 1, wherein the program further comprises a set of instructions for storing the encoded plurality of integer values in a file in a file storage.

3. The non-transitory machine-readable medium of claim 2, wherein the plurality of floating point values is a first plurality of floating point values, wherein the program further comprises sets of instructions for:
   receiving a query on the plurality of floating point values;
   in response to receiving the query, retrieving the file from the file storage;
   decoding the encoded plurality of integer values in the file based on the integer encoding scheme;
   converting the decoded plurality of integer values to a second plurality of floating point values;
   unscaling the second plurality of floating point values; and
   processing the query on the second plurality of floating point values.

4. The non-transitory machine-readable medium of claim 3, wherein the scale value is a first scale value, wherein the first scale value is a power of 10, wherein the program further comprises a set of instructions for storing the first scale value in terms of an integer exponent produces the first scale value when a value of 10 is raised to the power of the integer exponent, wherein unscaling the plurality of floating point values comprises calculating a second scale value by raising a value of 10 to a power of the integer exponent and dividing plurality of floating point values by calculated second scale value.

5. The non-transitory machine-readable medium of claim 1, wherein scaling the plurality of floating point values comprises multiplying each floating point value in the plurality of floating point values by the scale value.

6. The non-transitory machine-readable medium of claim 1, wherein the program further comprises a set of instructions for receiving a request to store the plurality of floating point values in a file.

7. The non-transitory machine-readable medium of claim 1, wherein determining the scale value comprises iterating through the plurality of floating point values, identifying the lowest floating point value in the plurality of floating point values, and determining a value for the scale value such that multiplying the lowest floating point value by the scale value produces the lowest integer.

8. A method comprising:
determining a scale value based on a plurality of floating point values, the scale value being a value that when multiplied with each of the floating point values produces integers, said determining the scale value comprising:
multiplying each of the plurality of floating point values by a first value and checking if each product is an integer, and
when each product is not an integer, multiplying each of the floating point values by a second value and checking if each product is an integer;
scaling the plurality of floating point values based on the scale value;
converting the plurality of floating point values to a plurality of integer values;
determining an integer encoding scheme from a plurality of integer encoding schemes; and
encoding the plurality of integer values based on the determined integer encoding scheme.

9. The method of claim 8 further comprising storing the encoded plurality of integer values in a file in a file storage.

10. The method of claim 9, wherein the plurality of floating point values is a first plurality of floating point values, wherein the method further comprises:
receiving a query on the plurality of floating point values;
in response to receiving the query, retrieving the file from the file storage;
decoding the encoded plurality of integer values in the file based on the integer encoding scheme;
converting the decoded plurality of integer values to a second plurality of floating point values;
unscaling the second plurality of floating point values; and
processing the query on the second plurality of floating point values.

11. The method of claim 10, wherein the scale value is a first scale value, wherein the first scale value is a power of 10, wherein the method further comprises storing the first scale value in terms of an integer exponent produces the first scale value when a value of 10 is raised to the power of the integer exponent, wherein unscaling the plurality of floating point values comprises calculating a second scale value by raising a value of 10 to a power of the integer exponent and dividing plurality of floating point values by calculated second scale value.

12. The method of claim 8, wherein scaling the plurality of floating point values comprises multiplying each floating point value in the plurality of floating point values by the scale value.

13. The method of claim 8 further comprising receiving a request to store the plurality of floating point values in a file.

14. The method of claim 8, wherein determining the scale value comprises iterating through the plurality of floating point values, identifying the lowest floating point value in the plurality of floating point values, and determining a value for the scale value such that multiplying the lowest floating point value by the scale value produces the lowest integer.

15. A system comprising:
a set of processing units; and
a non-transitory machine-readable medium storing instructions that when executed by at least one processing unit in the set of processing units cause the at least one processing unit to:
determine a scale value based on a plurality of floating point values, the scale value being a value that when multiplied with each of the floating point values produces integers, said determining the scale value comprising:
multiplying each of the plurality of floating point values by a first value and checking if each product is an integer, and
when each product is not an integer, multiplying each of the floating point values by a second value and checking if each product is an integer;
scale the plurality of floating point values based on the scale value;
convert the plurality of floating point values to a plurality of integer values;
determine an integer encoding scheme from a plurality of integer encoding schemes; and
encode the plurality of integer values based on the determined integer encoding scheme.

16. The system of claim 15, wherein the instructions further cause the at least one processing unit to store the encoded plurality of integer values in a file in a file storage.

17. The system of claim 16, wherein the plurality of floating point values is a first plurality of floating point values, wherein the instructions further cause the at least one processing unit to:
receive a query on the plurality of floating point values;
in response to receiving the query, retrieve the file from the file storage;
decode the encoded plurality of integer values in the file based on the integer encoding scheme;
convert the decoded plurality of integer values to a second plurality of floating point values;
unscale the second plurality of floating point values; and
process the query on the second plurality of floating point values.

18. The system of claim 17, wherein the scale value is a first scale value, wherein the first scale value is a power of 10, wherein the instructions further cause the at least one processing unit to store the first scale value in terms of an integer exponent produces the first scale value when a value of 10 is raised to the power of the integer exponent, wherein unscaling the plurality of floating point values comprises calculating a second scale value by raising a value of 10 to a power of the integer exponent and dividing plurality of floating point values by calculated second scale value.

19. The system of claim 15, wherein scaling the plurality of floating point values comprises multiplying each floating point value in the plurality of floating point values by the scale value.

20. The system of claim 15, wherein the instructions further cause the at least one processing unit to receive a request to store the plurality of floating point values in a file.

* * * * *